US012696598B2

(12) United States Patent
Pyo et al.

(10) Patent No.: US 12,696,598 B2
(45) Date of Patent: Jul. 28, 2026

(54) DISPLAY DEVICE AND MANUFACTURING METHOD OF THE SAME

(71) Applicant: Samsung Display Co., LTD., Yongin-si (KR)

(72) Inventors: Ki Hyun Pyo, Yongin-si (KR); Kyung Bae Kim, Yongin-si (KR); Ji Hye Lee, Yongin-si (KR); Sung Chul Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 393 days.

(21) Appl. No.: 18/191,915

(22) Filed: Mar. 29, 2023

(65) Prior Publication Data

US 2024/0006569 A1     Jan. 4, 2024

(30) Foreign Application Priority Data

Jun. 29, 2022     (KR) ........................ 10-2022-0079622

(51) Int. Cl.
H10H 20/856        (2025.01)
H01L 25/075        (2006.01)
(Continued)

(52) U.S. Cl.
CPC ......... H10H 20/856 (2025.01); H01L 25/167 (2013.01); *H10H 20/0363* (2025.01)

(58) Field of Classification Search
CPC .... H10H 20/856; H10H 20/841; H10H 20/01; H10H 29/142; H01L 25/167; H01L 25/0753
See application file for complete search history.

(56) References Cited

U.S. PATENT DOCUMENTS 11,626,537 B2     4/2023     Yun et al.
11,942,574 B2     3/2024     Chu et al.
(Continued)

FOREIGN PATENT DOCUMENTS

KR     10-2020-0005711 A     1/2020
KR     10-2021-0057891         5/2021
(Continued)

OTHER PUBLICATIONS

Korean Notice of Allowance issued in corresponding KR Application No. 10-2022-0079622, dated Mar. 23, 2026, 2 pages.

*Primary Examiner* — Antonio B Crite
(74) *Attorney, Agent, or Firm* — Womble Bond Dickinson (US) LLP

(57)     ABSTRACT

A display device includes: a first internal bank and a second internal bank spaced apart on a substrate; a first reflective layer disposed on the first internal bank; a second reflective layer spaced apart from the first reflective layer and disposed on the second internal bank; a first insulating layer disposed on the first reflective layer and the second reflective layer; a first electrode disposed on the first insulating layer and overlapping the first reflective layer; a second electrode disposed on the first insulating layer, overlapping the second reflective layer, and being spaced apart from the first electrode; a second insulating layer disposed on the first electrode and the second electrode; and a light emitting element disposed on the second insulating layer and overlapping a space between the first electrode and the second electrode.

20 Claims, 16 Drawing Sheets

(51) Int. Cl.

| | |
|---|---|
| *H01L 25/16* | (2023.01) |
| *H10D 86/01* | (2025.01) |
| *H10D 86/40* | (2025.01) |
| *H10H 20/01* | (2025.01) |
| *H10H 20/819* | (2025.01) |
| *H10H 20/831* | (2025.01) |
| *H10H 20/84* | (2025.01) |
| *H10H 20/841* | (2025.01) |
| *H10H 20/857* | (2025.01) |
| *H10H 29/14* | (2025.01) |

(56)                    References Cited

U.S. PATENT DOCUMENTS

| | | | |
|---|---|---|---|
| 12,074,264 | B2 | 8/2024 | Kim et al. |
| 12,317,649 | B2 | 5/2025 | Chu et al. |
| 2022/0084999 | A1* | 3/2022 | Lee .................... H10H 20/8515 |
| 2022/0173274 | A1* | 6/2022 | Lee ...................... H10H 20/856 |
| 2022/0181521 | A1* | 6/2022 | Chu ..................... H10H 20/857 |
| 2024/0379917 | A1 | 11/2024 | Kim et al. |

FOREIGN PATENT DOCUMENTS

| | | | |
|---|---|---|---|
| KR | 10-2021-0143984 A | 11/2021 | |
| KR | 10-2022-0081455 A | 6/2022 | |

* cited by examiner

RME: RME1, RME2
CNE: CNE1, CNE2
BP: BP1, BP2
RL: RL1, RL2

FIG. 8

RME: RME1, RME2
CNE: CNE1, CNE2
BP: BP1, BP2
RL: RL1, RL2
CCL: BL, GI, IL1, PV1

RME: RME1, RME2
BP: BP1, BP2
RL: RL1, RL2

RME: RME1, RME2
BP: BP1, BP2
RL: RL1, RL2

DISPLAY DEVICE AND MANUFACTURING METHOD OF THE SAME

CROSS-REFERENCE TO RELATED APPLICATION(S)

This application claims priority to and benefits of Korean Patent Application No. 10-2022-0079622 under 35 U.S.C. § 119, filed on Jun. 29, 2022, in the Korean Intellectual Property Office, the entire contents of which are incorporated herein by reference.

BACKGROUND

1. Technical Field

Embodiments relate to a display device and a manufacturing method of the display device.

2. Description of the Related Art

The importance of display devices has steadily increased with the development of multimedia technology. Thus, various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) formed of an organic material as a fluorescent material and an inorganic light emitting diode formed of an inorganic material as a fluorescent material.

An inorganic light emitting diode formed of an inorganic semiconductor as a fluorescent material has an advantage in that it has durability even in a high temperature environment, and has higher efficiency of blue light than an organic light emitting diode.

SUMMARY

Embodiments provide a display device capable of improving optical efficiency of pixels.

Embodiments provide a method of manufacturing a display device capable of improving optical efficiency of pixels.

However, embodiments are not limited to those set forth herein. The above and other embodiments will become more apparent to one of ordinary skill in the art to which the disclosure pertains by referencing the detailed description of the disclosure given below.

According to an embodiment, a display device may include: a first internal bank and a second internal bank spaced apart from each other on a substrate; a first reflective layer disposed on the first internal bank; a second reflective layer spaced apart from the first reflective layer and disposed on the second internal bank; a first insulating layer disposed on the first reflective layer and the second reflective layer; a first electrode disposed on the first insulating layer and overlapping the first reflective layer; a second electrode disposed on the first insulating layer and overlapping the second reflective layer and spaced apart from the first electrode; a second insulating layer disposed on the first electrode and the second electrode; and a light emitting element disposed on the second insulating layer and overlapping a space between the first electrode and the second electrode.

In an embodiment, a reflectance of the first reflective layer may be higher than a reflectance of the first electrode, and the reflectance of the second reflective layer may be higher than a reflectance of the second electrode.

In an embodiment, the first reflective layer and the second reflective layer may include at least one of silver (Ag), copper (Cu), and aluminum (Al).

In an embodiment, a transmittance of the first electrode may be higher than a transmittance of the first reflective layer, and a transmittance of the second electrode may be higher than a transmittance of the second reflective layer.

In an embodiment, the first electrode and the second electrode may include a transparent conductive oxide.

In an embodiment, a display device may further include a via insulating layer disposed on the substrate; and a driving transistor disposed between the via insulating layer and the substrate, the driving transistor that applies a first power voltage to the light emitting element, wherein the first internal bank and the second internal bank may be disposed directly on the via insulating layer, the first electrode may be electrically connected to the driving transistor through a contact hole penetrating the via insulating layer, and the first reflective layer may be electrically insulated from the driving transistor by the via insulating layer.

In an embodiment, a display device may further include a first connection electrode disposed on the second insulating layer, overlapping the first insulating layer, and being in contact with a first end portion of the light emitting element, wherein the first connection electrode may be electrically connected through a contact hole penetrating the first electrode and the second insulating layer, and the first connection electrode and the first reflective layer may be electrically insulated from each other.

In an embodiment, a display device may further include a power line disposed between the via insulating layer and the substrate, the power line that applies a second power voltage having a potential value lower than that of the first power voltage to the light emitting element, wherein the second electrode may be electrically connected to the power line through a second contact hole penetrating the via insulating layer, and the second reflective layer may be electrically insulated from the power line by the via insulating layer.

In an embodiment, a display device may further include a second electrode disposed on the second insulating layer and overlapping the second reflective layer and being in contact with the second end portion of the light emitting element, wherein the second electrode may be electrically connected to a contact hole penetrating the second electrode and the second insulating layer, and the second electrode may be electrically insulated from the second reflective layer.

In an embodiment, the first electrode may be in direct contact with a source electrode of the driving transistor, the source electrode may include copper, and the first electrode comprises a transparent conductive oxide.

In an embodiment, the second electrode may be in direct contact with the power line, the power line may include copper, and the second electrode may include a transparent conductive oxide.

In an embodiment, edge portions of the first reflective layer in plan view may extend edge portions of the first internal bank in plan view, and edge portions of the second reflective layer in plan view may extend edge portions of the second internal bank in plan view.

In an embodiment, the first reflective layer may completely cover the first internal bank, and the second reflective layer may completely cover the second internal bank.

According to an embodiment, a method of manufacturing a display device, the method may include: forming an internal bank on a substrate; forming a first internal bank and a second internal bank by etching the internal bank, the first internal bank spaced apart from the second internal bank; forming a reflective material layer on the first internal bank and the second internal bank; forming a first reflective layer and a second first reflective layer by etching the reflective material layer, the first reflective layer disposed on the first internal bank, the second first reflective layer spaced apart from the first reflective layer and disposed on the second internal bank; forming a first insulating layer on the first reflective layer and the second reflective layer; forming a first electrode and a second electrode on the first insulating layer, the first electrode overlapping the first reflective layer, the second electrode spaced apart from the first electrode and overlapping the second reflective layer; and aligning light emitting elements on a space between the first electrode and the second electrode.

In an embodiment, a reflectance of the first reflective layer may be higher than a reflectance of the first electrode, and a reflectance of the second reflective layer may be higher than a reflectance of the second electrode.

In an embodiment, the first reflective layer and the second reflective layer may include at least one of silver (Ag), copper (Cu), or aluminum (Al).

In an embodiment, a transmittance of the first electrode may be higher than a transmittance of the first reflective layer, and a transmittance of the second electrode may be higher than a transmittance of the second reflective layer.

In an embodiment, the first electrode and the second electrode may include transparent conductive oxide.

In an embodiment, the etching of the internal bank and the etching of the reflective material layer may be performed by a same mask.

In an embodiment, edge portions of the first reflective layer in plan view may extend edge portions of the first internal bank in plan view, and edge portions of the second reflective layer in plan view may extend edge portions of the second internal bank in plan view.

The display device according to an embodiment may have an improved optical efficiency of pixels.

The method for manufacturing a display device according to an embodiment may provide a display device with improved optical efficiency of pixels.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which:

FIG. 8 is a schematic cross-sectional view of a schematic cross-section taken along line X2-X2' of FIG. 6.

DETAILED DESCRIPTION OF THE EMBODIMENTS

Figure 1:
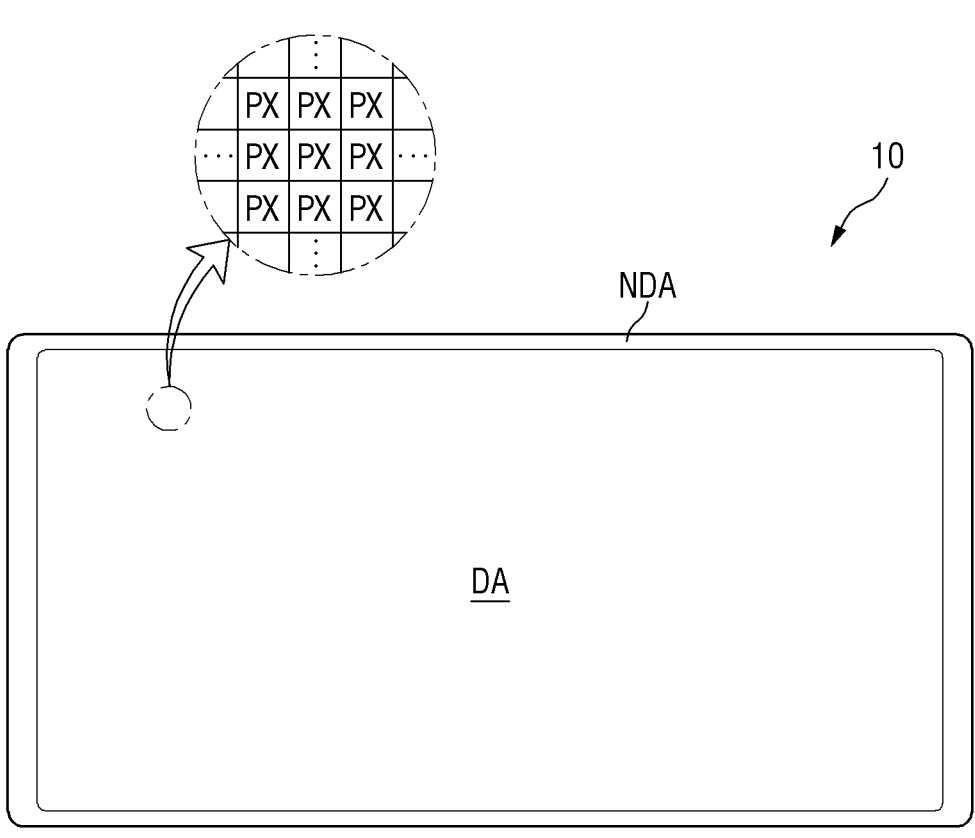
FIG. 1 is a schematic plan view of a display device according to an embodiment.
Figure 1:
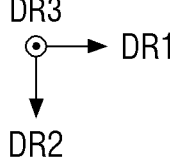

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, specific embodiments will be described with reference to the attached drawings.

FIG. 1 is a schematic plan view of a display device according to an embodiment.

In FIG. 1, a first direction DR1, a second direction DR2, and a third direction DR3 are defined. The first direction DR1 and the second direction DR2 may be perpendicular to each other, the first direction DR1 and the third direction DR3 may be perpendicular to each other, and the second direction DR2 and the third direction DR3 may be perpendicular to each other. It may be understood that the first direction DR1 refers to a horizontal direction in the drawing, the second direction DR2 refers to a vertical direction in the drawing, and the third direction DR3 refers to an up-down direction in the drawing, e.g., a thickness direction.

In the following specification, unless otherwise specified, a "direction" may refer to directions (e.g., opposite directions) extending to sides (e.g., opposite sides) along the direction. When it is necessary to distinguish "directions" extending to sides (e.g., opposite sides), a side is referred to as "a side in the direction," and another side is referred to as "another side in the direction." Referring to FIG. 1, a direction in which an arrow is directed is referred to as a side, and a direction opposite to the direction is referred to as another side.

In the following description of the surfaces of the display device 1 or the elements of the display device 1, the surfaces facing a side where images are displayed, i.e., the third direction DR3 will be referred to as the upper surface, and the opposite surfaces will be referred to as the lower surface for convenience of illustration. It should be understood, however, that embodiments are not limited thereto. However, embodiments are not limited thereto, and a surface and another surface of each member may also be referred to as a front surface and a rear surface, respectively, or may be referred to as a first surface and a second surface. In the description of relative positions of the elements of the display device 1, a side in the third direction DR3 may be referred to as the upper side, and the opposite side in the third direction DR3 may be referred to as the lower side.

Referring to FIG. 1, a display device 1 may display a moving image or a still image. The display device 1 may refer to any electronic device including a display screen. Examples of the display device 1 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which include a display screen.

The display device 1 may include a display panel which includes a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be described, but embodiments are not limited thereto, and other display panels may be applied thereto.

The shape of the display device 1 may be variously modified. For example, the display device 1 may have a shape such as a rectangular shape elongated in a horizontal direction, a rectangular shape elongated in a vertical direction, a square shape, a quadrilateral shape with rounded corners (e.g., vertices), other polygonal shapes and a circular shape. The shape of a display area DA of the display device 1 may also be similar to the overall shape of the display device 1. In FIG. 1, a display device 1 having a rectangular shape having a long length in the second direction DR2 is illustrated.

The display device 1 may include a display area DA and a non-display area NDA. The display area DA is an area where a screen may be displayed, and the non-display area NDA is an area where a screen is not displayed. The display area DA may also be referred to as an active region, and the non-display area NDA may also be referred to as a non-active region. The display area DA may substantially occupy the center of the display device 1.

The display area DA may include pixels PX. The pixels PX may be arranged in a matrix. The shape of each pixel PX may be a rectangular or square shape in plan view. However, embodiments are not limited thereto, and it may be a rhombic shape in which each side is inclined with respect to a direction. The pixels PX may be disposed in a stripe type or an island type. For example, each of the pixels PX may include one or more light emitting elements that emit light of a specific wavelength band to display a specific color.

The non-display area NDA may be disposed around the display area DA. The non-display area NDA may completely or partially surround the display area DA. The display area DA may have a rectangular shape, and the non-display area NDA may be adjacent to four sides of the display area DA. The non-display area NDA may form a bezel of the display device 1. Wirings or circuit drivers included in the display device 1 may be disposed in the non-display area NDA, or external devices may be mounted thereon.

Figure 2:
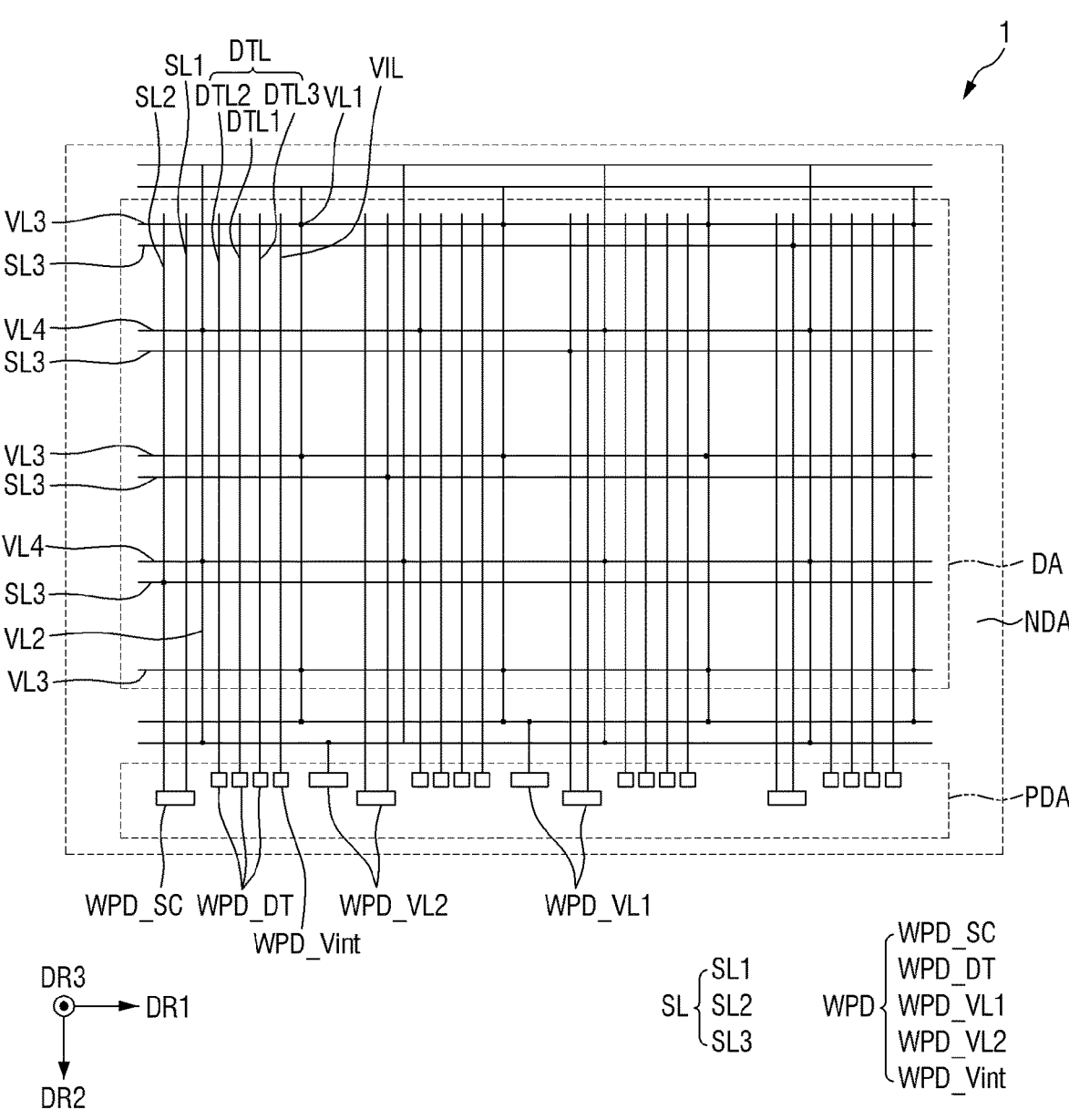
FIG. 2 is a is a schematic layout view illustrating wires of a display device according to an embodiment.

FIG. 2 is a schematic layout view illustrating wires of a display device according to an embodiment.

Referring to FIG. 2, the display device 1 may include wires. The display device 1 may include scan lines SL (e.g., SL1, SL2, and SL3), data lines DTL1, DTL2, and DTL3, an initialization voltage line VIL, and voltage lines VL1, VL2, VL3, and VL4. The scan lines SL may include first, second, and third scan lines SL1, SL2, and SL3. For example, other wires may be further included in the display device 1. The wires may include wires formed of a first conductive layer and extending in a first direction DR1, and wires formed of a third conductive layer and extending in the second direction DR2. However, the extension directions of the wires are not limited thereto.

The first scan line SL1 and the second scan line SL2 may extend in the first direction DR1. The first scan line SL1 and the second scan line SL2 may be adjacent to each other, and may be spaced apart from the different first scan line SL1 and second scan line SL2 in the second direction DR2. The first scan line SL1 and the second scan line SL2 may be connected to a scan line pad WPD_SC connected to a scan driver (not illustrated). The first scan line SL1 and the second scan line SL2 may extend from a pad area PDA disposed in the non-display area NDA to the display area DA.

The third scan line SL3 may extend in the second direction DR2, and may be spaced apart from another third scan line SL3 in the first direction DR1. One third scan line SL3 may be connected to one or more first scan lines SL1 or one or more second scan lines SL2. The scan lines SL may have a mesh structure in the entire surface of the display area DA, but embodiments are not limited thereto.

The term "connected" as used herein may mean not only that one member is connected to another member through a physical contact, but also that one member is connected to another member through yet another member. This may also be understood as a part and another part as integral elements are connected into an integrated element via another element. Furthermore, in case that one element is connected to another element, this may be construed as a meaning including an electrical connection via another element in addition to a direct connection in physical contact.

The data lines DTL may extend in the first direction DR1. The data line DTL may include a first data line DTL1, a second data line DTL2, and a third data line DTL3, and each of the first to third data lines DTL1, DTL2, and DTL3 may form a pair and may be adjacent to each other. Each of the data lines DTL1, DTL2, and DTL3 may extend from the pad area PDA disposed in the non-display area NDA to the display area DA. However, embodiments are not limited thereto, and the data lines DTL may be spaced apart from each other at equal distances between a first voltage line VL1 and a second voltage line VL2 to be described below.

The initialization voltage line VIL may extend in the first direction DR1. The initialization voltage line VIL may be disposed between the data lines DTL and the first voltage line VL1. The initialization voltage line VIL may extend from the pad area PDA disposed in the non-display area NDA to the display area DA.

The first voltage line VL1 and the second voltage line VL2 may extend in the first direction DR1, and the third voltage line VL3 and the fourth voltage line VL4 may extend in the second direction DR2. The first voltage line VL1 and the second voltage line VL2 may be alternately disposed in the second direction DR2, and the third voltage line VL3 and the fourth voltage line VL4 may be alternately disposed in the first direction DR1. The first voltage line VL1 and the second voltage line VL2 may extend in the first direction DR1 to cross the display area DA, and as for the third voltage line VL3 and the fourth voltage line VL4, some of the wires may be disposed in the display area DA and other wires may be disposed in the non-display area NDA positioned on sides (e.g., opposite sides) of the display area DA in the first direction DR1, respectively. The first voltage line VL1 and the second voltage line VL2 may be formed of the first conductive layer, and the third voltage line VL3 and the fourth voltage line VL4 may be formed of the third conductive layer disposed on a layer different from the first conductive layer. The first voltage line VL1 may be connected to at least one third voltage line VL3, the second voltage line VL2 may be connected to at least one fourth voltage line VL4, and the voltage lines VL may have a mesh structure in the entire display area DA. However, embodiments are not limited thereto.

The first scan line SL1, the second scan line SL2, the data line DTL, the initialization voltage line VIL, the first voltage line VL1, and the second voltage line VL2 may be connected (e.g., electrically connected) to at least one line pad WPD. Each line pad WPD may be disposed in the non-display area NDA. In an embodiment, each of the line pads WPD may be disposed in the pad area PDA positioned on the lower side, which is another side of the display area DA in the first direction DR1. The first scan line SL1 and the second scan line SL2 may be connected to the scan line pad WPD_SC disposed in the pad area PDA, and the data lines DTL may be connected to the data line pads WPD_DT different from each other, respectively. The initialization voltage line VIL may be connected to an initialization line pad WPD_Vint, the first voltage line VL1 may be connected to a first voltage line pad WPD_VL1, and the second voltage line VL2 may be connected to a second voltage line pad WPD_VL2. The external devices may be mounted on the line pads WPD. The external devices may be mounted on the line pads WPD by applying an anisotropic conductive film, ultrasonic bonding or the like. The drawing illustrates that each of the line pads WPD is disposed on the pad area PDA disposed on the lower side of the display area DA, but embodiments are not limited thereto. Some of the line pads WPD may be disposed in any one area on the upper side or on the left and right sides of the display area DA.

Each pixel PX or sub-pixel SPXn (where n is an integer of 1 to 3) of the display device 1 may include a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may be variously modified. According to an embodiment, in each sub-pixel SPXn of the display device 1, the pixel driving circuit may have a 3T-1C structure including three transistors and one capacitor. Hereinafter, the pixel driving circuit of the 3T-1C structure will be described as an example, but embodiments are not limited thereto, and various other modified structures such as a 2T-1C structure, a 7T-1C structure, and a 6T-1C structure may be applied.

Figure 3:
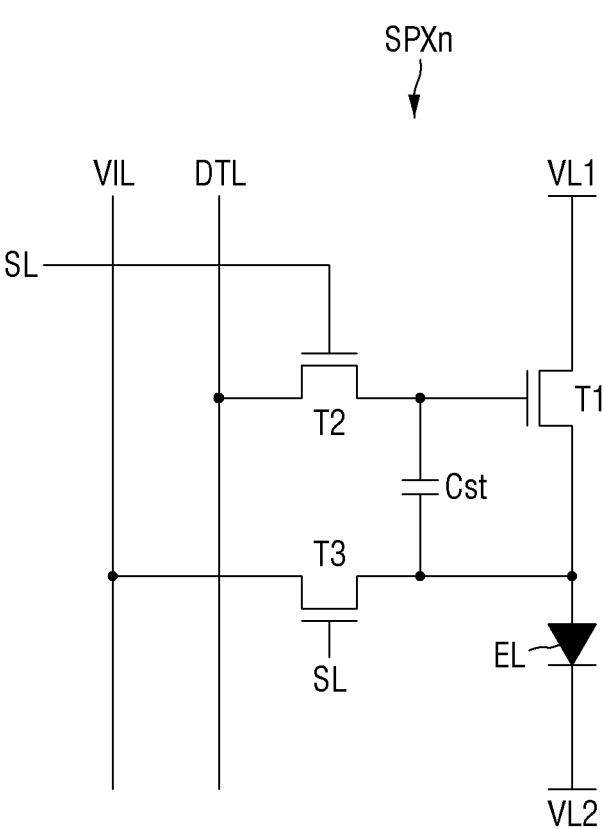
FIG. 3 is a schematic diagram of an equivalent circuit of a sub-pixel according to an embodiment.

FIG. 3 is a schematic diagram of an equivalent circuit of a sub-pixel according to an embodiment.

Referring to FIG. 3, each sub-pixel SPXn of the display device 1 according to an embodiment may include three transistors T1, T2, and T3 and one storage capacitor Cst in addition to a light emitting diode EL.

The light emitting diode EL may emit light by a current supplied through a first transistor T1. The light emitting diode EL may include a first electrode, a second electrode, and at least one light emitting element disposed between them. The light emitting element may emit light of a specific wavelength band by electrical signals transmitted from the first electrode and the second electrode.

An end portion of the light emitting diode EL may be connected to the source electrode of the first transistor T1, and another end portion thereof may be connected to the second voltage line VL2 to which a low potential voltage (hereinafter, a second power voltage) lower than a high potential voltage (hereinafter, a first power voltage) of the first voltage line VL1 is supplied.

The first transistor T1 may adjust a current flowing from the first voltage line VL1, to which the first power voltage is supplied, to the light emitting diode EL according to the voltage difference between the gate electrode and the source electrode. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VL1 to which the first power voltage is applied.

The second transistor T2 may be turned on by a scan signal of a scan line SL to connect the data line DTL to the gate electrode of the first transistor T1. The gate electrode of the second transistor T2 may be connected to the scan line SL, the source electrode thereof may be connected to the gate electrode of the first transistor T1, and the drain electrode thereof may be connected to the data line DTL.

The third transistor T3 may be turned on by a scan signal of the scan line SL to connect the initialization voltage line VIL to an end portion of the light emitting diode EL. The gate electrode of the third transistor T3 may be connected to the scan line SL, the drain electrode thereof may be connected to the initialization voltage line VIL, and the source electrode thereof may be connected to an end portion of the light emitting diode EL or to the source electrode of the first transistor T1.

In an embodiment, the source electrode and the drain electrode of each of the transistors T1, T2, and T3 are not limited to those described above, and vice versa. Each of the transistors T1, T2, and T3 may be formed of a thin film transistor. In FIG. 3, each of the transistors T1, T2, and T3 has been described as being formed of an N-type metal oxide semiconductor field effect transistor (MOSFET), but embodiments are not limited thereto. For example, each of the transistors T1, T2, and T3 may be formed of a P-type MOSFET. In another example, some of the transistors T1, T2, and T3 may be formed of an N-type MOSFET and the others may be formed of a P-type MOSFET.

The storage capacitor Cst may be formed between the gate electrode and the source electrode of the first transistor T1. The storage capacitor Cst stores a difference voltage between a gate voltage and a source voltage of the first transistor T1.

In the embodiment of FIG. 3, the gate electrode of the second transistor T2 may be connected to the scan line SL1, and the gate electrode of the third transistor T3 may be connected to the scan line SL2. For example, the second transistor T2 and the third transistor T3 may be turned on in response to a scan signal applied from the same scan line. However, embodiments are not limited thereto, and the second transistor T2 and the third transistor T3 may be connected to different scan lines and turned on in response to scan signals applied from different scan lines.

Hereinafter, a pixel PX structure of a display device 1 according to an embodiment will be described.

Figure 4:
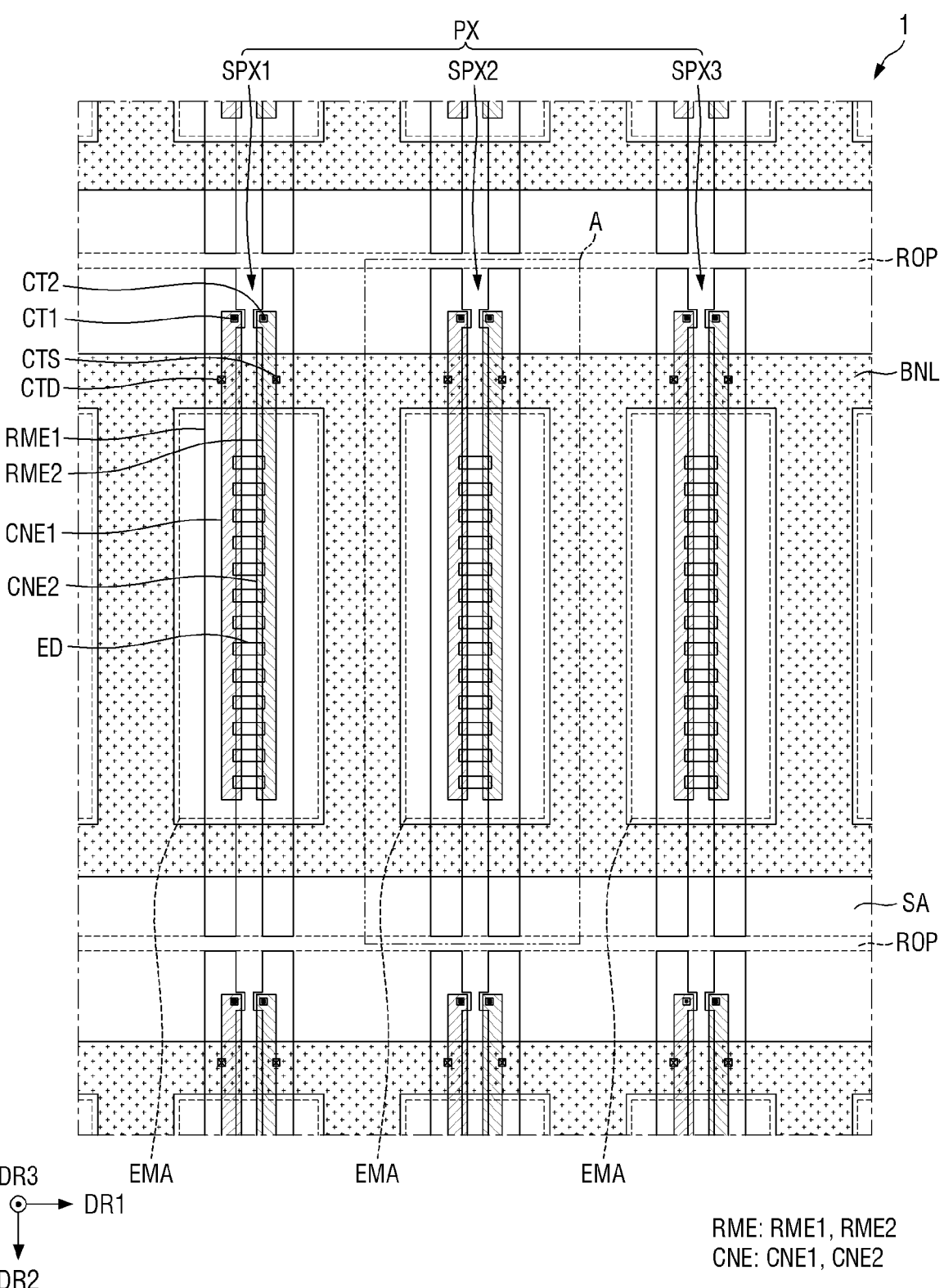
FIG. 4 is a schematic plan view showing a structure of a pixel of a display device according to an embodiment.
Figure 5:
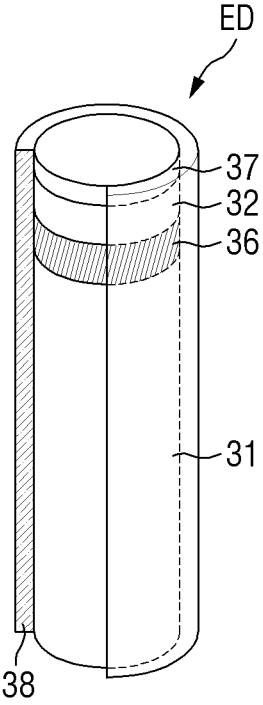
FIG. 5 is a schematic perspective view illustrating a structure of a light emitting element of FIG. 4.
Figure 6:
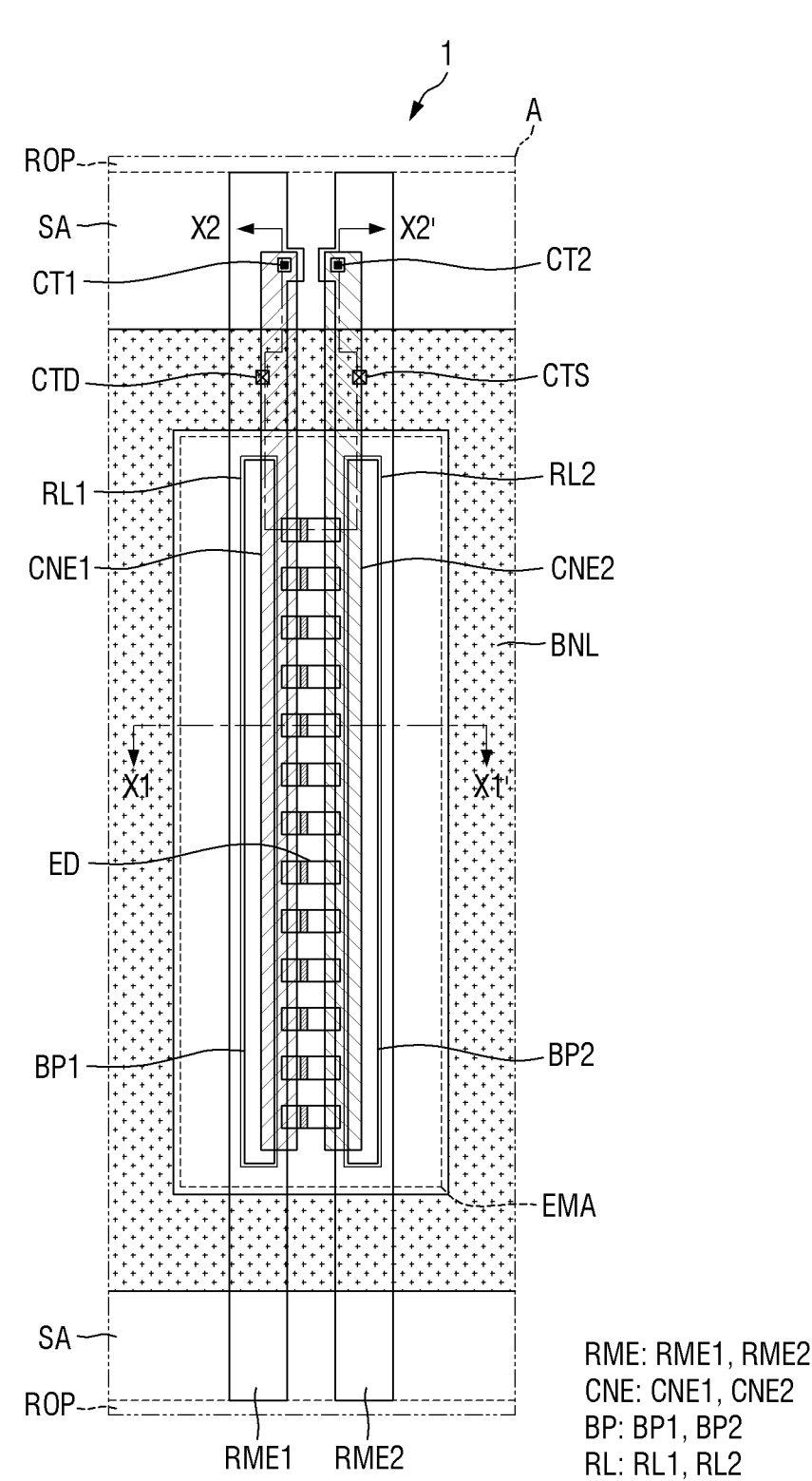
FIG. 6 is a schematic enlarged view of region A of FIG. 4.

FIG. 4 is a schematic plan view showing a structure of a pixel of a display device according to an embodiment. FIG. 5 is a schematic perspective view illustrating a structure of a light emitting element of FIG. 4. FIG. 6 is a schematic enlarged view of region A of FIG. 4.

Referring to FIGS. 4 to 6, each of the pixels PX of the display device 1 may include sub-pixels SPXn. For example, one pixel PX may include a first sub-pixel SPX1, a second sub-pixel SPX2 and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, embodiments are not limited thereto, and the sub-pixels SPXn may emit light of the same color. For example, the sub-pixels SPXn may emit the same blue light. Although it is illustrated in the drawing that one pixel PX includes three sub-pixels SPXn, embodiments are not limited thereto, and the pixel PX may include a larger number of sub-pixels SPXn. Hereinafter, for descriptive convenience, a case where one pixel PX includes three sub-pixels SPXn will be described.

The first sub-pixel SPX1, the second sub-pixel SPX2 and the third sub-pixel SPX3 may be sequentially arranged in a side in the first direction DR1. For example, the first sub-pixel SPX1 may be adjacent to a side of the third sub-pixel SPX3 in the first direction DR1.

Accordingly, at least one sub-pixel SPXn of one pixel PX and the sub-pixel SPXn of the one pixel PX may be adjacent to the at least one sub-pixel SPXn of the sub-pixels SPXn adjacent to the one pixel PX. Referring to FIG. 4, the third sub-pixel SPX3 of the pixel PX disposed on another side (e.g., right side) in the first direction DR1 may be adjacent to the first sub-pixel SPX1 of the pixel PX adjacent to the pixel disposed on another side (e.g., right side) in the first direction DR1.

Each sub-pixel SPXn of the display device 1 may include an emission area EMA and a non-emission area. The emission area EMA may be an area in which the light emitting element ED is disposed to emit light of a specific wavelength band. The non-emission area may be a region in which the light emitting element ED is not disposed and a region from which light is not emitted because light emitted from the light emitting element ED does not reach the non-emission area.

The emission area EMA may be defined by the external bank BNL. For example, emission area EMA may be a space surrounded by the external bank BNL. In some embodiments, the emission area EMA may have a rectangular shape including a short side in the first direction DR1 and a long side in the second direction DR2, but embodiments are not limited thereto.

The emission area EMA may include a region in which the light emitting element ED is disposed, and a region adjacent to the light emitting element ED and from which lights emitted from the light emitting element ED are emitted. For example, the emission area EMA may further include a region in which the light emitted from the light emitting element ED is reflected or refracted by another member and emitted. The light emitting elements ED may be disposed in each sub-pixel SPXn, and the emission area may include an area where the light emitting elements ED are disposed and an area adjacent thereto.

Although it is shown in the drawing that the sub-pixels SPXn have the emission areas EMA that are substantially identical in size, embodiments are not limited thereto. In some embodiments, the emission areas EMA of the sub-pixels SPXn may have different sizes according to a color or wavelength band of light emitted from the light emitting element ED disposed in each sub-pixel.

Each sub-pixel SPXn may further include a sub-region SA disposed in the non-emission area. The sub-region SA may be a divided area according to the arrangement of alignment electrodes RME. The sub-region SA may be adjacent to a side and another side of the emission area EMA in the second direction DR2. The emission area EMA may be alternately arranged along the first direction DR1, and the sub-region SA may extend in the first direction DR1. Each of the emission areas EMA and the sub-regions SA may be repeatedly disposed in the second direction DR2. The emission areas EMA may each be disposed between the sub-regions SA.

The sub-region SA may be shared by the sub-pixels SPXn adjacent to each other in the first direction DR1. For example, the first sub-pixel SPX1, the second sub-pixel SPX2 and the third sub-pixel SPX3 may share the sub-region SA. For example, the sub-region SA may be an area shared by the sub-pixels SPXn adjacent to each other in the second direction DR2. For example, the sub-regions SA disposed on sides (e.g., opposite sides) of the second direction DR2 of the external bank BNL shown in FIG. 4 may not be illustrated with the sub-pixels SPXn illustrated in the drawing and may be shared by the sub-pixels SPXn adjacent in the second direction DR2.

The light emitting element ED may not be disposed in the sub-regions SA and thus light may not be emitted therefrom. The electrodes RME disposed in the sub-pixels PXn may be disposed (e.g., partially disposed) in the sub-regions SA. The alignment electrodes RME disposed in different sub-pixels PXn may be disposed separately from one another in separation regions ROP of the sub-regions SA.

The alignment electrodes RME and connection electrodes CNE may be disposed in each sub-pixel SPXn in a shape extending in the second direction DR2.

The alignment electrode RME may include a first alignment electrode RME1 and a second alignment electrode RME2 sequentially arranged in the first direction DR1 in one sub-pixel SPXn. Each of the first alignment electrode RME1 and the second alignment electrode RME2 may be spaced apart from each other in the first direction DR1.

The first alignment electrode RME1 may be adjacent to a side (e.g., left side) of the emission area EMA in the first direction DR1. For example, the first alignment electrode RME1 may be spaced apart in the first direction DR1 from a portion of the external bank BNL defining a side (e.g., left side) of the emission area EMA in the first direction DR1.

The first alignment electrode RME1 may have a shape extending in the second direction DR2. In some embodiments, the first alignment electrode RME1 may have a rectangular planar shape (e.g., profile or outline) in plan view, but embodiments are not limited thereto. FIGS. 4 and 6 illustrate the first alignment electrode RME1 having a rectangular planar shape (e.g., profile).

The first alignment electrode RME1 may be connected (e.g., electrically connected) to a circuit element layer CCL (refer to FIG. 8) to be described below through a first electrode contact hole CTD. The first alignment electrode RME1 may receive the above-described first power voltage through the first electrode contact hole CTD.

The second alignment electrode RME2 may be adjacent to a side of the first alignment electrode RME1 in the first direction DR1. The second alignment electrode RME2 may be adjacent to another side (e.g., right side) of emission area EMA in the first direction DR1. For example, the second alignment electrode RME2 may be spaced apart in the first direction DR1 from a portion of the external bank BNL forming a side of the emission area EMA in the first direction DR1.

The second alignment electrode RME2 may have a shape extending in the second direction DR2. In some embodiments, the second alignment electrode RME2 may have a rectangular planar shape (e.g., profile) in plan view, but embodiments are not limited thereto. FIGS. 4 and 6 illustrate the second alignment electrode RME2 having a rectangular planar shape (e.g., profile).

The second alignment electrode RME2 may be connected (e.g., electrically connected) to the circuit element layer CCL (refer to FIG. 8) to be described below through a second electrode contact hole CTS. The second alignment electrode RME2 may receive the above-described second power voltage through the second electrode contact hole CTS.

For example, the first electrode contact hole CTD and the second electrode contact hole CTS may not overlap the emission area EMA. In some embodiments, the first electrode contact hole CTD and the second electrode contact hole CTS may overlap the external bank BNL, but embodiments are not limited thereto. For example, the first electrode contact hole CTD and the second electrode contact hole CTS may be disposed in the sub-region SA. FIGS. 4 and 6 illustrate that the first electrode contact hole CTD and the second electrode contact hole CTS overlap the external bank BNL.

Internal banks BP may be disposed under each of the alignment electrodes RME. The internal banks BP may be disposed in the emission area EMA of the sub-pixel SPXn. The internal banks BP may include a first internal bank BP1 and a second internal bank BP2 each having a rectangular planar shape extending in the second direction DR2. The first internal bank BP1 and the second internal bank BP2 may be spaced apart from each other in the first direction DR1.

The first internal bank BP1 may be disposed under the first alignment electrode RME1 in the emission area EMA, and the second internal bank BP2 may be disposed under the second alignment electrode RME2 in the emission area EMA.

In some embodiments, the alignment electrodes RME may cover (e.g., completely cover) each internal bank BP disposed under each of the alignment electrodes RME in the emission area EMA, but embodiments are not limited thereto. For example, the alignment electrodes RME may cover (e.g., partially cover) each internal bank BP disposed under each alignment electrode RME in the emission area EMA. FIG. 6 illustrates the alignment electrodes RME to completely cover each internal bank BP disposed under each alignment electrode RME in the emission area EMA.

Reflective layers RL may be disposed between each of the alignment electrodes RME and each of the internal banks BP. Each of the reflective layers RL may include a first reflective layer RL1 and a second reflective layer RL2 having a rectangular planar shape extending in the second direction DR2. The first reflective layer RL1 and the second reflective layer RL2 may be spaced apart from each other in the first direction DR1.

The first reflective layer RL1 may be disposed between the first internal bank BP1 and the first alignment electrode RME1, and the second reflective layer RL2 may be disposed between the second internal bank BP2 and the second alignment electrode RME2.

The planar shape (e.g., profile) of the first reflective layer RL1 and the planar shape (e.g., profile) of the first internal bank BP1 may be substantially the same as each other. For example, edge portions (or sides) of the first reflective layer RL1 may extend along edge portions (or sides) of the first internal bank BP1 in plan view. For example, the planar shape (e.g., profile) of the second reflective layer RL2 and the planar shape (e.g., profile) of the second internal bank BP2 may be substantially the same as each other. For example, edge portions (or sides) of the second reflective layer RL2 may extend along edge portions (or sides) of the second internal bank BP2 in plan view. For example, the width in the first direction DR1 and the width in the second direction DR2 of the first reflective layer RL1 may be substantially the same or similar to the width in the first direction DR1 and the second direction DR2 of the first internal bank BP1, respectively. The width of the second reflective layer RL2 in the first direction DR1 and the width of the second reflective layer RL2 in the second direction DR2 may be substantially the same as or similar to the width of the second internal bank BP2 in the first direction DR1 and the width of the second internal bank BP2 in the second direction DR2, respectively. This may be because the same mask is used to form the internal bank BP and the reflective layer RL in a display device manufacturing process to be described below. A detailed description thereof will be provided below.

Accordingly, in some embodiments, the reflective layers RL may cover (e.g., completely cover) each of the internal banks BP disposed under the reflective layer RL in the emission area EMA, but embodiments are not limited thereto. In case that the internal bank BP and the reflective layer are respectively formed by using different masks in a manufacturing process of the display device, the reflective layers RL may only cover a portion of each of the internal bank BP disposed under each reflective layer RL. FIG. 6 illustrates that the reflective layers RL cover (e.g., completely cover) each of the internal banks BP disposed under each of the reflective layers RL in the emission area EMA.

For example, the alignment electrodes RME may be spaced apart from each other in the first direction DR1 to provide a space in which the light emitting element ED is disposed. For example, the light emitting elements ED may be disposed on the space between the first alignment electrode RME1 and the second alignment electrode RME2.

Referring to FIG. 5, the light emitting element ED may be a light emitting diode. For example, the light emitting element ED may be an inorganic light emitting diode that has a nanometer or micrometer size, and is made of an inorganic material. The light emitting element ED may be aligned between two electrodes having polarity in case that an electric field is formed in a specific direction between two electrodes opposing each other.

The light emitting element ED according to an embodiment may have a shape elongated in a direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in a direction and having an outer surface partially inclined.

The light emitting element ED may include a semiconductor layer doped with any conductivity type (e.g., p-type or n-type) dopant. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37 and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \le x \le 1$, $0 \le y \le 1$, $0 \le x+y \le 1$). For example, the first semiconductor layer 31 may be any one or more of AlGaInN, GaN, AlGaN, InGaN, AlN and InN doped with an n-type dopant. The n-type dopant doped into the first semiconductor layer 31 may be Si, Ge, Sn, Se or the like.

The second semiconductor layer 32 may be disposed on the first semiconductor layer 31 with the light emitting layer 36 therebetween. The second semiconductor layer 32 may be a p-type semiconductor, and the second semiconductor layer 32 may include a semiconductor material having a chemical formula of $Al_xGa_yIn_{1-x-y}N$ ($0 \le x \le 1$, $0 \le y \le 1$, $0 \le x+y \le 1$). For example, the second semiconductor layer 32 may be any one or more of AlGaInN, GaN, AlGaN, InGaN, AlN and InN doped with a p-type dopant. The p-type dopant doped into the second semiconductor layer 32 may be Mg, Zn, Ca, Ba, or the like.

Accordingly, end portions (e.g., opposite end portions) of the light emitting element ED may have different polarities. Hereinafter, for descriptive convenience, an end portion to which the second semiconductor layer 32 is adjacent among end portions (e.g., opposite end portions) of the light emitting element ED is referred to as a "first end portion", and another end portion to which the first semiconductor layer 31 is adjacent to is referred to as "the second end portion". The first end portion of the light emitting element ED may be positioned opposite to the second end portion thereof.

The first end portion and the second end portion of the light emitting element ED may have different polarities. For example, the first end portion of each of the different light emitting elements ED may have the same polarity and the second end portion of each of the different light emitting elements ED may have different polarities.

For example, although it is illustrated in the drawing that the first semiconductor layer 31 and the second semiconductor layer 32 are configured as a single layer, embodiments are not limited thereto. According to the material of the light emitting layer 36, the first semiconductor layer 31 and the second semiconductor layer 32 may further include a larger number of layers, such as a cladding layer or a tensile strain barrier reducing (TSBR) layer. For example, the light emitting element ED may further include another semiconductor layer disposed between the first semiconductor layer 31 and the light emitting layer 36 or between the second semiconductor layer 32 and the light emitting layer 36. A semiconductor layer disposed between the first semiconductor layer 31 and the light emitting layer 36 may be any one or more of AlGaInN, GaN, AlGaN, InGaN, AlN, InN and SLs doped with an n-type dopant, and a semiconductor layer disposed between the second semiconductor layer 32 and the light emitting layer 36 may be any one or more of AlGaInN, GaN, AlGaN, InGaN, AlN, and InN doped with a p-type dopant.

The light emitting layer 36 may be disposed between the first semiconductor layer 31 and the second semiconductor layer 32. The light emitting layer 36 may include a material having a single quantum well structure or a multiple quantum well structure. In case that the light emitting layer 36 includes a material having a multiple quantum well structure, quantum layers and well layers may be stacked alternately. The light emitting layer 36 may emit light by coupling (or recombination) of electron-hole pairs according to an electrical signal applied through the first semiconductor layer 31 and the second semiconductor layer 32. The light emitting layer 36 may include a material such as AlGaN, AlGaInN, or InGaN. In case that the light emitting layer 36 has a multiple quantum well structure in which quantum layers and well layers are alternately stacked, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy are alternately stacked, and may include other group III to V semiconductor materials according to the wavelength band of the emitted light. The light emitted by the light emitting layer 36 is not limited to the light of the blue wavelength band, but the light emitting layer 36 may also emit light of a red or green wavelength band in some cases.

The electrode layer 37 may be an ohmic connection electrode. However, embodiments are not limited thereto, and it may be a Schottky connection electrode. The light emitting element ED may include at least one electrode layer 37. The light emitting element ED may include one or more electrode layers 37, but embodiments are not limited thereto, and the electrode layer 37 may be omitted.

In the display device 1, in case that the light emitting element ED is connected (e.g., electrically connected) to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO. With the configuration as described above, end portions (e.g., opposite end portions) of each of the light emitting elements ED may have different polarities.

The insulating film 38 may be arranged to surround the outer surfaces of the semiconductor layers and electrode layers described above. For example, the insulating film 38 may surround at least the outer surface of the light emitting layer 36, and may expose end portions (e.g., opposite end portions) of the light emitting element ED in the longitudinal direction. Further, in cross-sectional view, the insulating film 38 may have a top surface (or upper surface), which is rounded in a region adjacent to at least one end portion of the light emitting element ED.

The insulating film 38 may include at least one of materials having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). It is illustrated in the drawing that the insulating film 38 is formed as a single layer, but embodiments are not limited thereto. In some embodiments, the insulating film 38 may be formed in a multilayer structure having layers stacked therein.

The insulating film 38 may perform a function of protecting the semiconductor layers and the electrode layer of the light emitting element ED. The insulating film 38 may prevent an electrical short circuit that is likely to occur at the light emitting layer 36 in case that an electrode to which an electrical signal is transmitted is in contact with (e.g., in direct contact with) the light emitting element ED. For example, the insulating film 38 may prevent a decrease in luminous efficiency of the light emitting element ED.

Further, the insulating film 38 may have an outer surface which is surface-treated. The light emitting elements ED may be aligned in such a way of spraying the ink in which the light emitting elements ED are dispersed on the electrodes. For example, the surface of the insulating film 38 may be treated to have a hydrophobic property or hydrophilic property in order to keep the light emitting elements ED in the dispersed state without being aggregated with other adjacent light emitting elements ED in the ink.

Referring back to FIGS. 4 and 6, the light emitting element ED may be disposed on a space between the first alignment electrode RME1 and the second alignment electrode RME2 within the emission area EMA of each sub-pixel SPXn to be arranged side by side in the second direction DR2.

A hatched portion is shown in each of the light emitting elements ED illustrated in FIG. 6. A hatched portion in each of the light emitting elements ED may be the light emitting layer 36 illustrated in FIG. 5. An end portion adjacent to the hatched portion of each of the light emitting elements ED may be the above-described first end portion, and the opposite end portion thereof may be the second end portion.

The light emitting element ED may extend in the first direction DR1 and may be oriented such that the first end portion may be disposed at a side of the first alignment electrode RME1 in the first direction DR1 and the second end portion may be disposed at another side of the second alignment electrode RME2.

The connection electrode CNE may be disposed on the light emitting elements ED. The connection electrode CNE may include a first connection electrode CNE1 and a second connection electrode CNE2 that are spaced apart from each other and sequentially arranged in a side of the first direction DR1.

The first connection electrode CNE1 and the second connection electrode CNE2 may be spaced apart from each other in the first direction DR1. For example, the second connection electrode CNE2 may be adjacent to a side of the first connection electrode CNE1 in the first direction DR1.

The first connection electrode CNE1 may be disposed on the first alignment electrode RME1 in the emission area EMA. The first connection electrode CNE1 may have a shape substantially extending in the second direction DR2 from the emission area EMA.

The first connection electrode CNE1 may be in contact with the first end portion of the light emitting element ED in the emission area EMA. For example, the first connection electrode CNE1 may extend in the second direction DR2 from the emission area EMA to be in contact with the first end portions of the light emitting elements ED arranged side by side in the second direction DR2 in the space between the first alignment electrode RME1 and the second alignment electrode RME2.

The first connection electrode CNE1 may be connected (e.g., electrically connected) to the first alignment electrode RME1 through a first contact portion CT1 in a region that does not overlap the emission area EMA. Accordingly, the first connection electrode CNE1 may receive the above-described first power voltage through the first alignment electrode RME1.

The second connection electrode CNE2 may be disposed on the second alignment electrode RME2 in the emission area EMA. The second connection electrode CNE2 may have a shape substantially extending in the second direction DR2 from the emission area EMA.

The second connection electrode CNE2 may be in contact with the second end portion of the light emitting element ED in the emission area EMA. For example, the second connection electrode CNE2 may extend in the second direction DR2 from the emission area EMA to be in contact with the second end portions of the light emitting elements ED arranged side by side in the second direction DR2 in a space between the first alignment electrode RME1 and the second alignment electrode RME2.

The second connection electrode CNE2 may be connected (e.g., electrically connected) to the second alignment electrode RME2 through a second contact portion CT2 in a region that does not overlap the emission area EMA. Accordingly, the second connection electrode CNE2 may receive the above-described second power voltage through the second alignment electrode RME2.

Hereinafter, a stacked structure of elements constituting the display device 1 according to an embodiment will be described.

Figure 7:
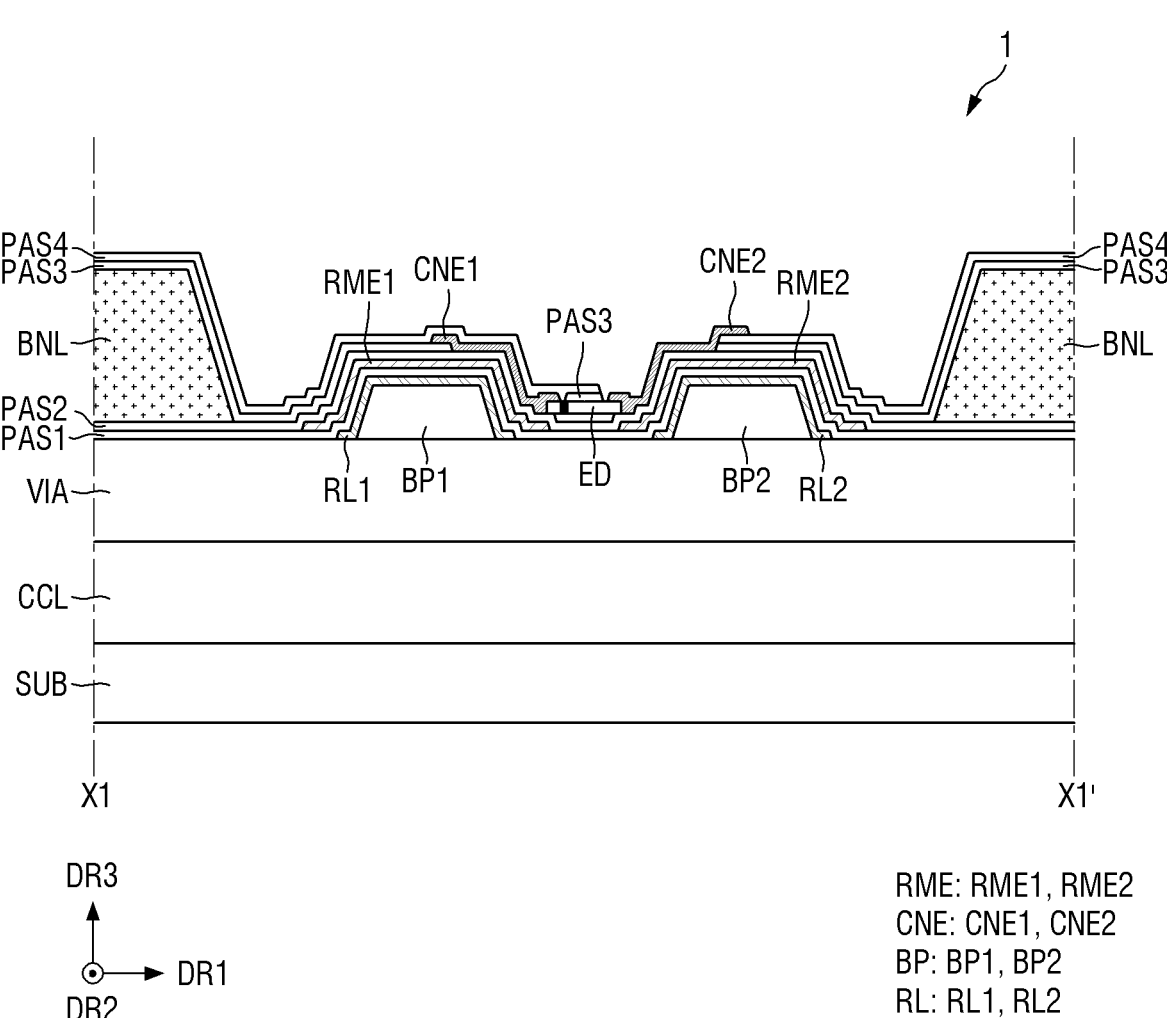
FIG. 7 is a schematic cross-sectional view of a schematic cross-section taken along line X1-X1' of FIG. 6.
Figure 8:
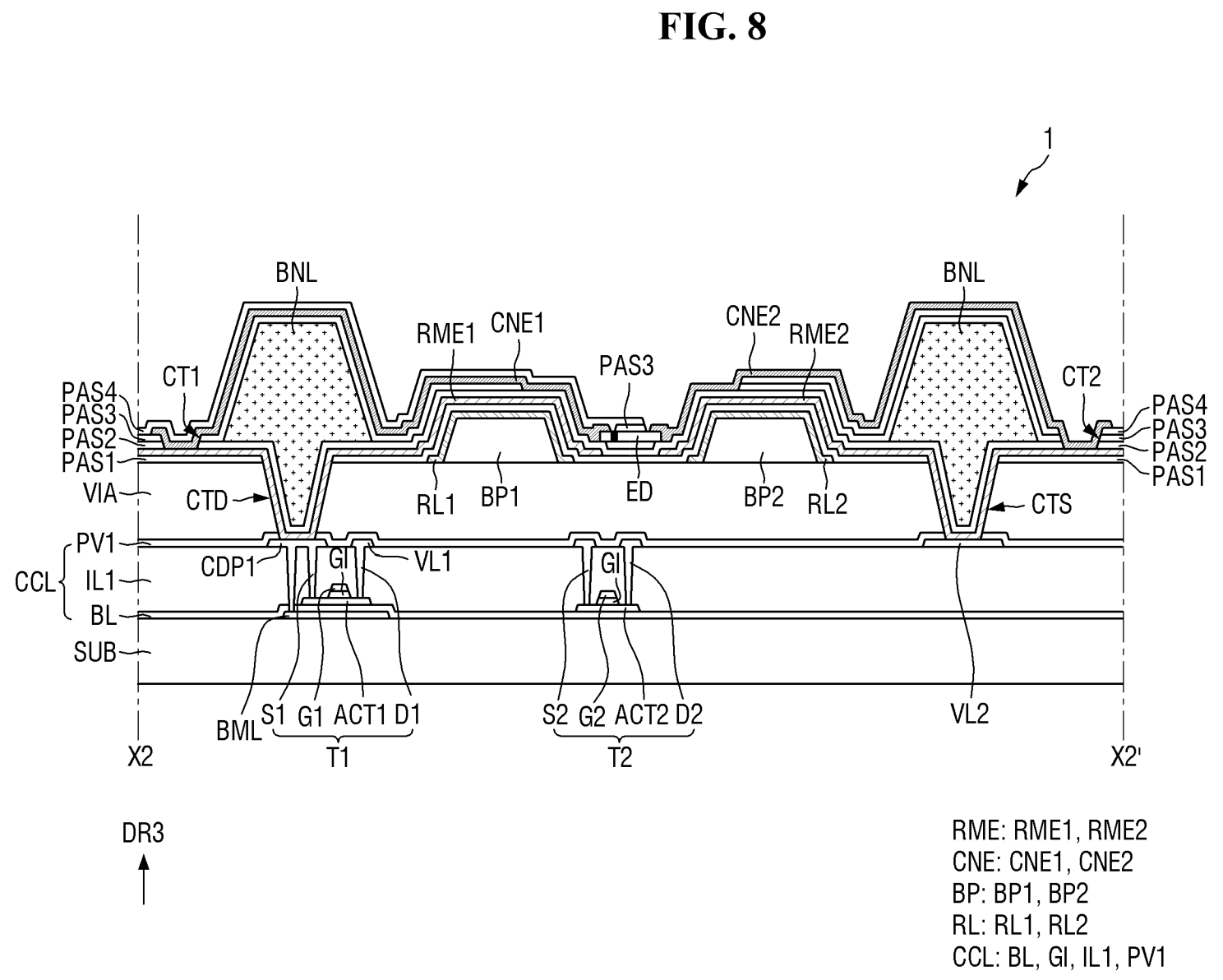

FIG. 7 is a schematic cross-sectional view of a schematic cross-section taken along lines X1-X1' of FIG. 6. FIG. 8 is a schematic cross-sectional view of a schematic cross-section taken along lines X2-X2" of FIG. 6.

The cross-sectional structure of the display device 1 is described with reference to FIGS. 7 and 8 in conjunction with FIG. 6. The display device 1 may include a substrate SUB, and a semiconductor layer, conductive layers, and insulating layers disposed thereon. For example, the display device 1 may include the electrodes RME, the light emitting element ED, and the connection electrodes CNE. The semiconductor layer, the conductive layers, and the insulating layers may each form a circuit element layer CCL of the display device 1.

The substrate SUB may be an insulating substrate. The substrate SUB may be made of an insulating material such as glass, quartz, or polymer resin. Further, the substrate SUB may be a rigid substrate, but may be a flexible substrate which is bendable, foldable, or rollable.

The circuit element layer CCL may be disposed on the substrate SUB. Various wirings transmitting electrical signal to the light emitting element ED disposed on the substrate SUB may be disposed in the circuit element layer CCL. As shown in FIG. 8, as conductive layers, the circuit element layer CCL may include a first conductive layer, a semiconductor layer, a second conductive layer, a third conductive layer, and the like, and as insulating layers, the circuit element layer CCL may include a buffer layer BL, a first gate insulating layer GI, a first interlayer insulating layer IL1, a first passivation layer PV1, and the like.

The first conductive layer may be disposed on the substrate SUB. The first conductive layer may include a lower metal layer BML. For example, the lower metal layer BML may overlap a first active layer ACT1 of the first transistor T1. The lower metal layer BML may prevent light from being incident on the first active layer ACT1 of the first transistor T1 or may be connected (e.g., electrically connected) to the first active layer ACT1 to perform a function of stabilizing electrical characteristics of the first transistor T1. In another example, the lower metal layer BML may be omitted.

A buffer layer BL may be disposed on the lower metal layer BML and the substrate SUB. The buffer layer BL may be formed on the substrate SUB to protect the transistors of the pixel PX from moisture permeating through the substrate SUB which is vulnerable to moisture permeation, and may perform a surface planarization function.

The semiconductor layer may be disposed on the buffer layer BL. The semiconductor layer may include a first active layer ACT1 of the first transistor T1 and a second active layer ACT2 of the second transistor T2. The first active layer ACT1 and the second active layer ACT2 may overlap (e.g., partially overlap) a first gate electrode G1 and a second gate electrode G2 of a second conductive layer to be described below.

The semiconductor layer may include polycrystalline silicon, single crystal silicon, an oxide semiconductor, or the like. In another embodiment, the semiconductor layer may also include polycrystalline silicon. The oxide semiconductor may be an oxide semiconductor including indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

It is illustrated in the drawing that a first transistor T1 and a second transistor T2 are disposed in the pixel PX of the display device 1, but embodiments are not limited thereto and the display device 1 may include a larger number of transistors.

A first gate insulating layer GI may be disposed on the semiconductor layer in the display area DA. The first gate insulating layer GI may function as a gate insulating layer of each of the transistors T1 and T2. It has been illustrated in the drawing that the first gate insulating layer GI is patterned together with gate electrodes G1 and G2 of a second conductive layer to be described below, and is partially disposed between the second conductive layer and the active layers ACT1 and ACT2 of the semiconductor layer. However, embodiments are not limited thereto. In some embodiments, the first gate insulating layer GI may be disposed (e.g., entirely disposed) on the buffer layer BL.

The second conductive layer may be disposed on the first gate insulating layer GI. The second conductive layer may include a first gate electrode G1 of the first transistor T1 and a second gate electrode G2 of the second transistor T2. The first gate electrode G1 may overlap a channel area of the first active layer ACT1 in the third direction DR3 (e.g., the thickness direction), and the second gate electrode G2 may overlap a channel area of the second active layer ACT2 in the third direction DR3 (e.g., the thickness direction).

The first interlayer insulating layer IL1 may be disposed on the second conductive layer. The first interlayer insulating layer IL1 may function as an insulating layer between the second conductive layer and other layers disposed thereon, and protect the second conductive layer.

The third conductive layer may be disposed on the first interlayer insulating layer IL1. The third conductive layer may include metal. In some embodiments, the third conductive layer may include molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu), but embodiments are not limited thereto. Hereinafter, for descriptive convenience, a case where the third conductive layer includes copper (Cu) will be described.

The third conductive layer may include the first voltage line VL1 and the second voltage line VL2 disposed in the display area DA, a first conductive pattern CDP1, and source electrode S1 and S2 and drain electrodes D1 and D2 of each of the transistors T1 and TR2.

A high potential voltage (or a first source voltage) transferred to a first alignment electrode RME1 may be applied to the first voltage line VL1, and a low potential voltage (or a second source voltage) transferred to a second alignment electrode RME2 may be applied to the second voltage line VL2. A portion of the first voltage line VL1 may be in contact with the first active layer ACT1 of the first transistor T1 through a contact hole penetrating through the first interlayer insulating layer IL1. The first voltage line VL1 may function as the first drain electrode D1 of the first transistor T1. The first voltage line VL1 may be connected (e.g., directly connected) to the first alignment electrode RME1 and the second voltage line VL2 may be connected (e.g., directly connected) to the second alignment electrode RME2.

The first conductive pattern CDP1 may be in contact with the first active layer ACT1 of the first transistor T1 through a contact hole penetrating through the first interlayer insulating layer IL1. The first conductive pattern CDP1 may be in contact with the lower metal layer BML through another contact hole penetrating through the first interlayer insulating layer IL1 and the buffer layer BL. The first conductive pattern CDP1 may function as a first source electrode S1 of the first transistor T1. For example, the first conductive pattern CDP1 may be connected to a first alignment electrode RME1 or a first connection electrode CNE1 to be described below. The first transistor T1 may transfer the first power voltage applied from the first voltage line VIA to the first alignment electrode RME1 or the first connection electrode CNE1.

The second source electrode S2 and the second drain electrode D2 may each contact the second active layer ACT2 of the second transistor T2 through the contact hole penetrating through the first interlayer insulating layer IL1.

The first passivation layer PV1 may be disposed on the third conductive layer. The first passivation layer PV1 may perform a function of an insulating film between the third conductive layer and other layers, and may protect the third conductive layer.

The buffer layer BL, the first gate insulating layer GI, the first interlayer insulating layer IL1, and the first passivation layer PV1 described above may be formed of inorganic layers alternately stacked. For example, the buffer layer BL, the first gate insulating layer GI, the first interlayer insulating layer IL1, and the first passivation layer PV1 may be formed of a double layer in which an inorganic layer including at least one of silicon oxide ($SiO_x$), silicon nitride ($SiN_x$), and silicon oxynitride ($SiO_xN_y$) is stacked, or multiple layers in which these layers are alternately stacked.

A via insulating layer VIA may be disposed on the circuit element layer CCL. For example, the via insulating layer VIA may be disposed on the first passivation layer PV1 of the circuit element layer CCL. The via insulating layer VIA may include an organic insulating material, for example, an organic insulating material such as polyimide, to compensate for a step caused by various wirings inside the circuit element layer CCL and to form a flat top surface (or flat upper surface).

An internal bank BP may be disposed on the top surface (or upper surface) of the via insulating layer VIA. For example, the via insulating layer VIA and the internal bank BP may be in contact (e.g., in direct contact).

The internal banks BP may be disposed on the via insulating layer VIA. The internal bank BP may have sides that are inclined or curved with a certain curvature, and light emitted from the light emitting dement ED may be reflected from the alignment electrode RME disposed on the internal bank BP to a side in the third direction DR3. The internal banks BP may include, but embodiments are not limited to, an organic insulating material made of a transparent material such as polyimide. For example, the internal banks BP may further include a colored dye such as a black pigment.

The reflective layers RL may be disposed on the internal bank BP and the via insulating layer VIA. The reflective layer RL may reflect light emitted from the light emitting element ED. For example, the light emitting elements ED may be disposed between the internal banks BP to emit light to end portions thereof (e.g., opposite end portions), and the emitted light may be directed to the reflective layer RL disposed on the internal bank BP. Accordingly, the light emitted from the light emitting element ED may be reflected by the reflective layer RL and emitted in the third direction DR3. Accordingly, lighting efficiency of pixels of the display device 1 may be improved.

The reflective layers RL may include a conductive material having a higher reflectance than the alignment electrodes RME. For example, the reflective layers RL may have a light reflectance higher than that of the alignment electrodes RME. For example, the reflective layers RL may have a light transmittance lower than that of the alignment electrodes RME. For example, the reflective layers RL may include a metal such as silver (Ag), copper (Cu), or aluminum (Al), or an alloy including aluminum (Al), nickel (Ni), and lanthanum (La), or may have a structure in which a metal layer such as titanium (Ti), molybdenum (Mo), and niobium (Nb) and the alloy are stacked.

In some embodiments, the reflective layers RL may be formed as a double layer or multiple layers formed by stacking at least one metal layer made of an alloy including aluminum (Al) and titanium (Ti), molybdenum (Mo), and niobium (Nb).

The first reflective layer RL1 may be disposed on the first internal bank BP1 to cover the first internal bank BP1. The second reflective layer RL2 may be disposed on the second internal bank BP2 to cover the second internal bank BP2.

The reflective layers RL may be electrically insulated from the circuit element layer CCL disposed under the via insulating layer VIA. For example, the reflective layers RL may not be in contact with (e.g., in direct contact with) the third conductive layer of the circuit element layer CCL, e.g., the first voltage line VL1 and the second voltage line VL2, the first conductive pattern CDP1 and the source electrodes S1 and S2 and the drain electrodes D1 and D2 of each transistors T1 and T2. This may be to prevent galvanic corrosion, which is occurred by the metal constituting the reflective layers RL having a different standard reduction potential value from the metal constituting the third conductive layer (e.g., copper (Cu)). Galvanic corrosion refers to a phenomenon in which corrosion is promoted in a metal having a relatively small standard reduction potential value.

In case that the reflective layer RL includes aluminum (AL) and the third conductive layer includes metal (Cu), Corrosion of the reflective layer RL including aluminum (Al) having a relatively small standard reduction potential value may be accelerated. Thus, it is necessary to electrically insulate the circuit element layer CCL including the reflective layer RL and the third conductive layer. Accordingly, the reflective layer RL may be electrically insulated from the circuit element layer CCL by the via insulating layer VIA.

A first insulating layer PAS1 may be disposed on the entire surface of the display area DA, and may be disposed on the via insulating layer VIA and the reflective layers RL. The first insulating layer PAS1 may include an insulating material to protect the reflective layers RL and simultaneously insulate the different reflective layers RL from each other. The first insulating layer PAS1 may insulate the reflective layers RL and the alignment electrodes RME disposed on the first insulating layer PAS1.

A portion of the first insulating layer PAS1 may be in contact with (e.g., in direct contact with) the via insulating layer VIA. For example, in a space where the first reflective layer RL1 and the second reflective layer RL2 are spaced apart, the first insulating layer PAS1 may be in contact with (e.g., in direct contact with) the via insulating layer VIA.

The alignment electrodes RME may be disposed on the first insulating layer PAS1. The first alignment electrode RME1 may be disposed on the first insulating layer PAS1 to overlap the first internal bank BP1 and the first reflective layer RL1 in the third direction DR3 and extend in the direction toward the second internal bank BP2. The second alignment electrode RME2 may be disposed on the first insulating layer PAS1 to overlap the second internal bank BP2 and the second reflective layer RL2 in the third direction DR3 and extend in the direction toward the first internal bank BP1.

A distance between the first and second alignment electrodes RME1 and RME2 may be smaller than a distance between the first and second internal banks BP1 and BP2, respectively. For example, a distance between the first alignment electrode RME1 and the second alignment electrode RME2 may be smaller than a distance between the first reflective layer RL1 and the second reflective layer RL2, respectively. Accordingly, the first alignment electrode RME1 and the second alignment electrode RME2 may extend to a portion in contact with (e.g., in direct contact with) the via insulating layer VIA in a space between the in a space between the first reflective layer RL1 and the second reflective layer RL2 of the first insulating layer PAS1.

The first alignment electrode RME1 may be in contact with the first conductive pattern CDP1 through the first electrode contact hole CTD penetrating the first insulating layer PAS1, the via insulating layer VIA and the first passivation layer PV1. The second alignment electrode RME2 may be in contact with the second voltage line VL2 through the second electrode contact hole CTS penetrating the first insulating layer PAS1, the via insulating layer VIA and the first passivation layer PV1.

The alignment electrodes may include a transparent conductive material (TCO). For example, each alignment electrode RME may include a material such as ITO, IZO or ITZO. Accordingly, even though the first alignment electrode RME1 is in contact with the first conductive pattern CDP1 in the first electrode contact hole CTD and the second alignment electrode RME2 may be in contact with the second voltage line VL2 in the second electrode contact hole CTS, the above-described dissimilar metal contact corrosion may be prevented. For example, since the transparent conductive oxide has good adhesion to copper (Cu), the contact resistance between the first alignment electrode RME1 and the first conductive pattern CDP1 and the contact resistance between the second alignment electrode RME2 and the second voltage line VL2 may be lowered.

A second insulating layer PAS2 may be disposed on the entire surface of the display area DA and may be disposed on the first insulating layer PAS1 and the alignment electrodes RME. The second insulating layer PAS2 may include an insulating material to protect the alignment electrodes RME and simultaneously insulate different alignment electrodes RME from each other. As the second insulating layer PAS2 covers the alignment electrodes. RME before the external bank BNL is formed, the alignment electrodes RME may be prevented from being damaged in the process in which the alignment electrodes RME forms the external bank BNL. For example, the second insulating layer PAS2 may prevent the light emitting element ED disposed thereon from being damaged by direct contact with other members.

In an embodiment, the second insulating layer PAS2 may have stepped portions such that the top surface (or upper surface) thereof may be partially depressed between the alignment electrodes RME spaced apart in the first direction DR1. The light emitting element ED may be disposed on the top surface (or upper surface) of the second insulating layer PAS2, where the stepped portions are formed, and thus a space may remain between the light emitting element ED and the second insulating layer PAS2.

The second insulating layer PAS2 may include contact portions CT1 and CT2. The contact portions may overlap different alignment electrodes RME, respectively. For example, the contact portions may include a first contact portion CT1 overlapping the first alignment electrode RME1 and a second contact portion CT2 overlapping the second alignment electrode RME2.

The first contact portion CT1 and the second contact portion CT2 may penetrate the second insulating layer PAS2 to expose a portion of the top surface (or upper surface) of the first alignment electrode RME1 or the second alignment electrode RME2 thereunder. Each of the first contact portion CT1 and the second contact portion CT2 may further penetrate some of the other insulating layers disposed on the second insulating layer PAS2. The alignment electrode RME exposed by the respective contact portions may contact the connection electrode CNE. As the light emitting elements ED are in contact with the connection electrodes CNE and are connected (e.g., electrically connected) to the alignment electrode RME and the circuit element layer CCL under the via insulating layer VIA, an electrical signal may be received to emit light of a specific wavelength band.

The external bank BNL may be disposed on the second insulating layer PAS2. The external bank BNL may include portions extending in the first direction DR1 and the second direction DR2, and may surround each sub-pixels SPXn. The external bank BNL may surround and distinguish (or define) each sub-pixel SPXn and surround the outermost part of the display area DA and distinguish (or define) the display area DA and the non-display area NDA.

Similarly to the internal bank BP, the external bank BNL may have a certain height. In some embodiments, the top surface (or upper surface) of the external bank BNL may be higher than that of the internal bank BP, and the thickness of the external bank BNL may be equal to or greater than that of the internal bank BP. Accordingly, the external bank BNL may prevent ink from overflowing to adjacent sub-pixels SPXn in an inkjet printing process during the manufacturing process of the display device 1. Similarly to the internal bank BP, the external bank BNL may include an organic insulating material of a transparent material such as poly-imide, but embodiments are not limited thereto. For example, the external bank BNL may include a colored dye such as a black pigment.

A third insulating layer PAS3 may be disposed on the light emitting elements ED, the second insulating layer PAS2, and the external bank BNL. The third insulating layer PAS3 may include a pattern portion disposed on the light emitting elements ED and extending in the first direction DR1 between the internal bank BP. The pattern portion of the third insulating layer PAS3 may surround (e.g., partially surround) the outer surface of the light emitting element ED, and may not cover sides (e.g., opposite sides) or end portions (e.g., opposite end portions) of the light emitting element ED. The pattern portion may form a linear or island-like pattern in each sub-pixel SPXn in plan view. The pattern portion of the third insulating layer PAS3 may protect the light emitting element ED and fix the light emitting elements ED during a manufacturing process of the display device 1. Further, the third insulating layer PAS3 may fill the space between the light emitting element ED and the second insulating layer PAS2 thereunder.

The third insulating layer PAS3 may include the contact portions CT1 and CT2. The contact portions CT1 and CT2 may overlap different alignment electrodes RME, respectively. For example, the contact portions CT1 and CT2 may include a first contact portion CT1 overlapping the first alignment electrode RME1 and a second contact portion CT2 overlapping the second alignment electrode RME2. The first contact portion CT1 and the second contact portion CT2 may penetrate the third insulating layer PAS3 to expose (e.g., partially expose) the top surface (or upper surface) of the first alignment electrode RME1 or the second alignment electrode RME2 thereunder. Each of the first contact portion CT1 and the second contact portion CT2 may further penetrate some of the other insulating layers disposed on the third insulating layer PAS3. The alignment electrode RME exposed by each of the contact portions CT1 and CT2 may be in contact with the connection electrode CNE. The light emitting elements ED may come into contact with the connection electrodes CNE and may be connected (e.g., electrically connected) to the circuit element layers CCL under the alignment electrode RME and the via insulating layer VIA, so that an electric signal is applied to the light emitting element ED to emit light of a specific wavelength band.

The first connection electrode CNE1 of the connection electrode CNE may be disposed on the third insulating layer PAS3. The first connection electrode CNE1 may overlap (e.g., partially overlap) the first alignment electrode RME1 in the emission area EMA and contact the first end portion of the light emitting element ED.

The first connection electrode CNE1 may extend from the emission area EMA to the external bank BNL as shown in FIG. 8. The first connection electrode CNE1 may contact the first alignment electrode RME1 through the first contact portion CT1 passing through the second insulating layer PAS2 and the third insulating layer PAS3. Accordingly, the first connection electrode CNE1 may be connected (e.g., electrically connected) to the first transistor T1 and the first power voltage may be applied thereto.

A fourth insulating layer PAS4 may be disposed on the third insulating layer PAS3, the first connection electrode CNE1, and the external bank BNL. The fourth insulating layer PAS4 may not cover an end portion of the light emitting element ED. For example, the fourth insulating layer PAS4 may not cover second end portions of the light emitting elements ED that do not contact the first connection electrode CNE1 in the emission area EMA.

The fourth insulating layer PAS4 may include the second contact portion CT2 overlapping the second alignment electrode RME2. The second contact portion CT2 may penetrate the fourth insulating layer PAS4 to expose a portion of the upper surface of the second alignment electrode RME2 thereunder.

The second alignment electrode RME2 exposed by the second contact portion CT2 may be in contact with the second connection electrode CNE2. Accordingly, the light emitting elements ED may come into contact with the connection electrodes CNE and may be connected (e.g., electrically connected) to the alignment electrode RME and the circuit element layer CCL under the via insulating layer VIA, and an electric signal may be applied to emit light in a specific wavelength band.

The second connection electrode CNE2 of the connection electrode CNE may be disposed on the fourth insulating layer PAS4. The second connection electrode CNE2 may overlap (e.g., partially overlap) the second alignment electrode RME2 in the emission area EMA and contact the second end portion of the light emitting element ED.

The second connection electrode CNE2 may extend from the emission area EMA to the external bank BNL as shown in FIG. 8. The second connection electrode CNE2 may contact the second alignment electrode RME2 through the second contact portion CT2 passing through the second insulating layer PAS2, the third insulating layer PAS3 and the fourth insulating layer PAS4. Accordingly, the second connection electrode CNE2 may be connected (e.g., electrically, connected) to the second voltage line VL2 and the second power voltage may be applied thereto.

The connection electrodes CNE may include a conductive material. For example, they may include ITO, IZO, ITZO, aluminum (Al), or the like. As an example, the connection electrodes CNE may include a transparent conductive material, and light emitted from the light emitting element ED may pass through the connection electrodes CNE to be emitted.

Each of the first insulating layer PAS1, the second insulating layer PAS2, the third insulating layer PAS3 and the fourth insulating layer PAS4 described above may include an inorganic insulating material or an organic insulating material. In an embodiment, each of the first insulating layer PAS1, the second insulating layer PAS2, the third insulating layer PAS3 and the fourth insulating layer PAS4 may be any one of silicon oxide ($SiO_x$), silicon nitride ($SiN_x$), and silicon oxynitride ($SiO_xN_y$). The first insulating layer PAS1, the second insulating layer PAS2, the third insulating layer PAS3, and the fourth insulating layer PAS4 may be made of the same material or different materials. In another example, some of them may be made of the same material and some of them may be made of different materials.

Hereinafter, a process for manufacturing the display device 1 will be described according to an embodiment.

FIGS. 9 to 16 are schematic cross-sectional views illustrating processes in a method of manufacturing a display device according to an embodiment.

FIGS. 9 to 16 are processes in a method of manufacturing a display device according to an embodiment illustrated in respect to the cross-section taken along line X1-X1' shown in FIG. 7.

Figure 9:
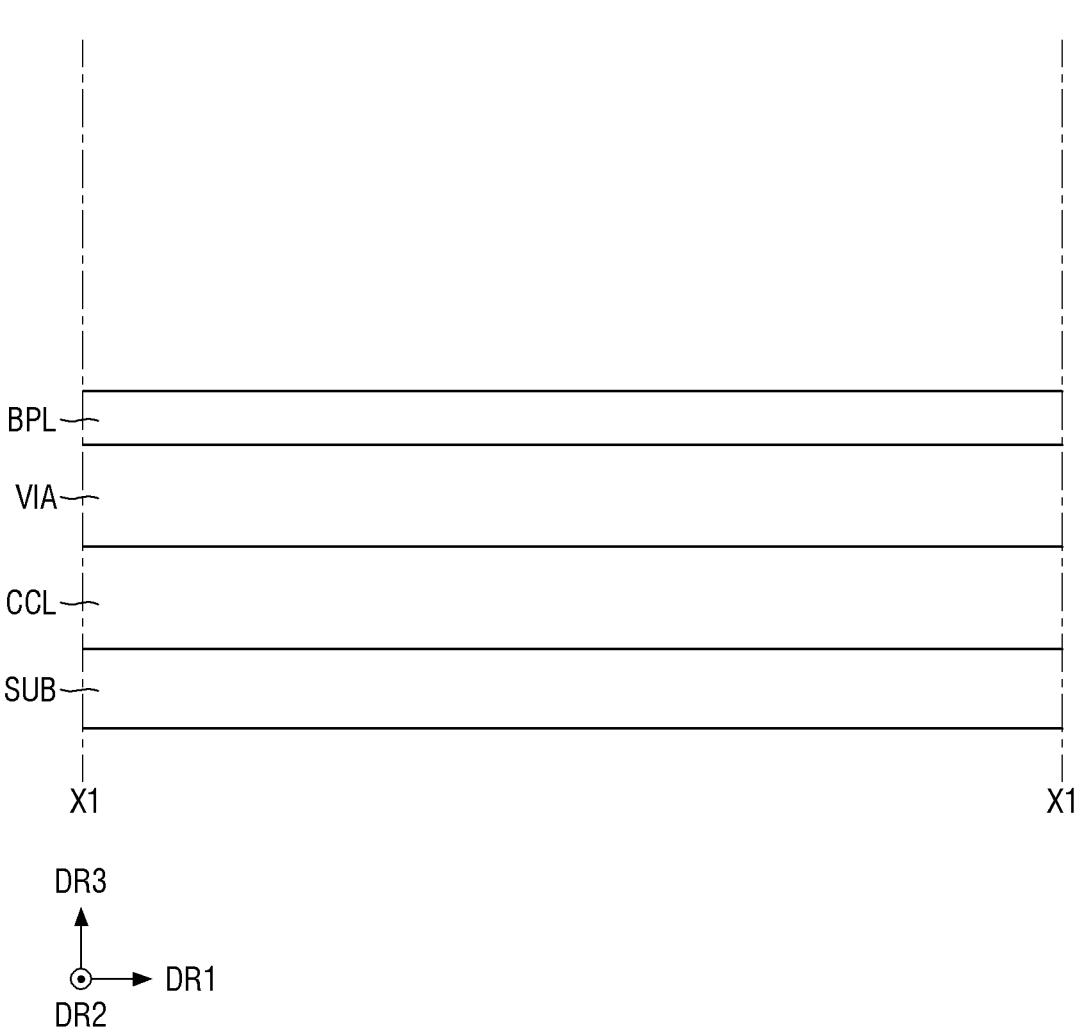
FIGS. 9 to 16 are schematic cross-sectional views illustrating processes in a method of manufacturing a display device according to an embodiment.

First, referring to FIG. 9, the circuit element layer CCL, the via insulating layer VIA and the internal bank BPL is sequentially formed on the substrate SUB.

Since the method of forming the circuit element layer CCL, the via insulating layer VIA, and the internal bank BPL on the substrate SUB is widely known, the detailed description thereof will be omitted for descriptive convenience.

Subsequently, referring to FIGS. 10 and 11, the internal bank BPL may be etched to form a first internal bank BP1 and a second internal bank BP2. The process of etching the internal bank BPL may be performed by a dry etching process in which a region of the internal bank BPL is selectively etched by using a mask MASK. The dry etching process may be performed by using $CF_4$ (carbon tetrafluoride) and $O_2$ plasma or a fluorine-based compound and $O_2$ plasma.

Figure 10:
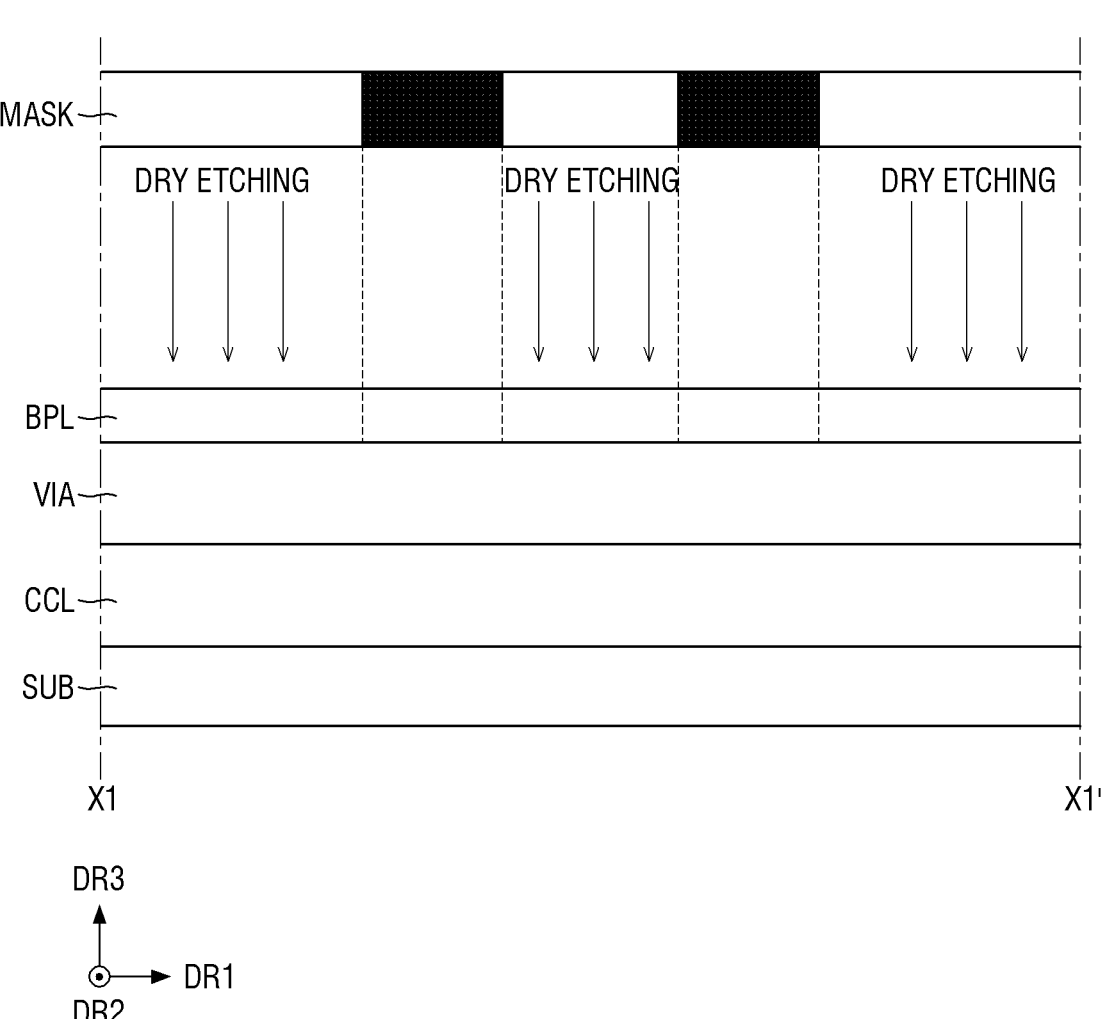
Figure 11:
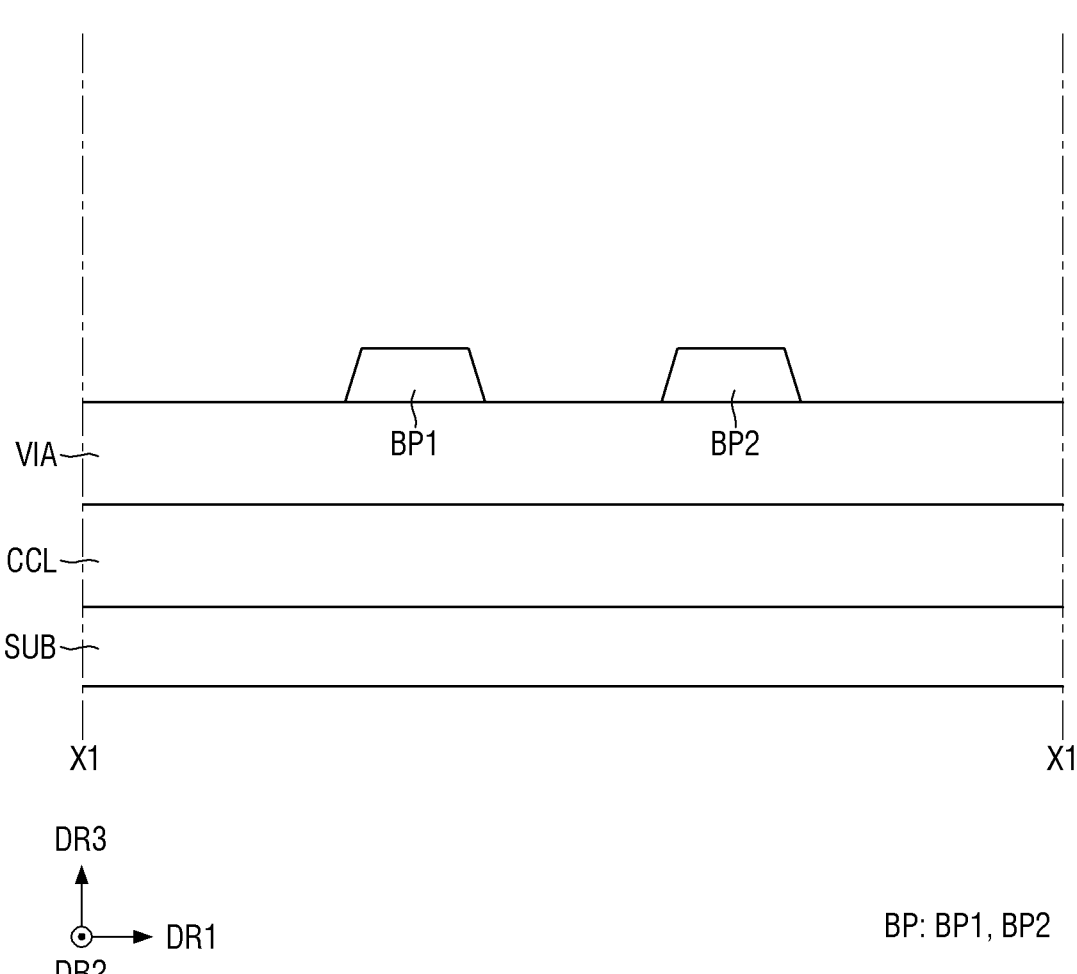

The mask MASK may include a hatched portion (e.g., dark portion) and an unhatched portion (e.g., white portion) as shown in FIG. 10. The hatched portion may function as an etch stop layer preventing the above-described etching gas from reaching the internal bank BPL. The non-hatched portion may transmit (or transfer) the above-described etching gas to the internal bank BPL.

The first internal bank BP1 and the second internal bank BP2 may overlap the hatched portion of the mask MASK among the internal bank BPL and may be a portion that is not etched by the above-described etching gas. For example, the first internal bank BP1 and the second internal bank BP2 may be portions of the internal bank. BPL that remains unetched.

Figure 12:
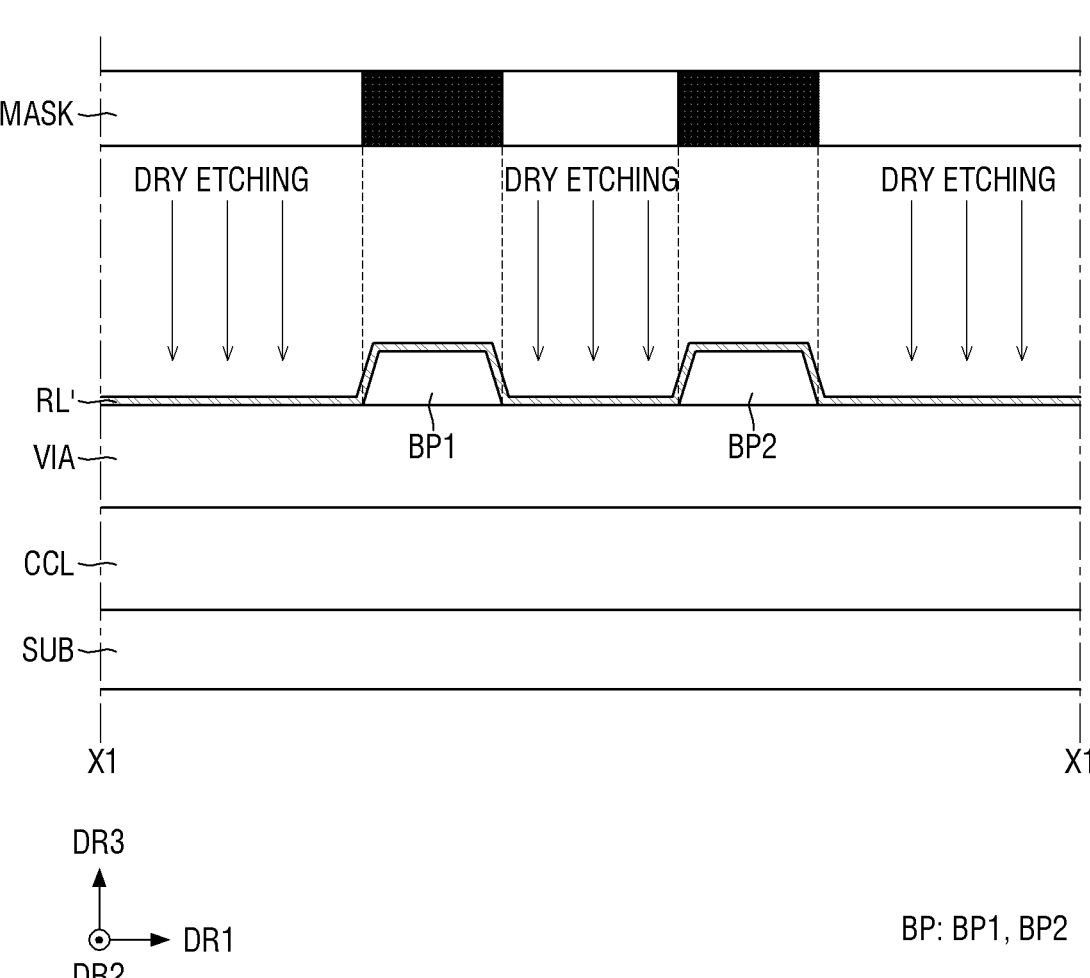
Figure 13:
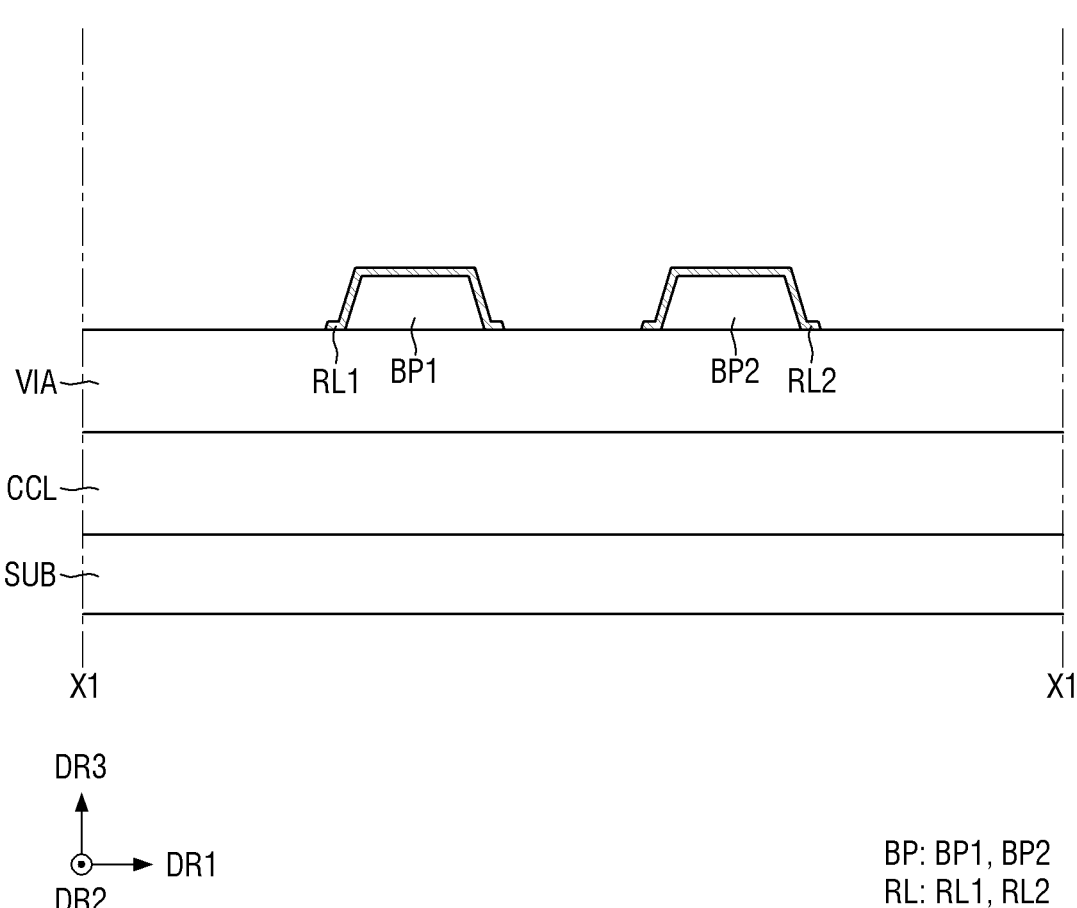

Referring to FIGS. 12 and 13, a reflective material layer RL' may be formed on the first internal hank BP1, the second internal bank BP2, and the via insulating layer VIA. The reflective material layer RL' may be etched to form a first reflective layer RL1 and a second reflective layer RL2.

The process of etching the reflective material layer RL' may be performed by a dry etching process in which a region of the reflective material layer RL' is selectively etched by using a mask MASK. The dry etching process may be performed by using carbon tetrafluoride ($CF_4$) and $O_2$ plasma or a fluorine-based compound and $O_2$ plasma.

For example, the mask MASK used to etch the reflective material layer RL' may be substantially the same as the mask MASK used to etch the internal bank BPL described in connection with FIGS. 10 and 11. Accordingly, processability may be improved by reducing the number of masks MASK required for the process.

In case that the reflective material layer RL' is etched by using the mask MASK that is substantially the same as the mask MASK used for etching the internal bank BPL, the first reflective layer RL1 and the second reflective layer RL2 may have substantially the same planar shape (e.g., profile) as the first internal bank BP1 and the second internal bank BP2, respectively. For example, edge portions of the first reflective layer RL1 and the second reflective layer RL2 may extend along edge portions of the first internal bank BP1 and the second internal bank BP2, respectively, in plan view.

Figure 14:
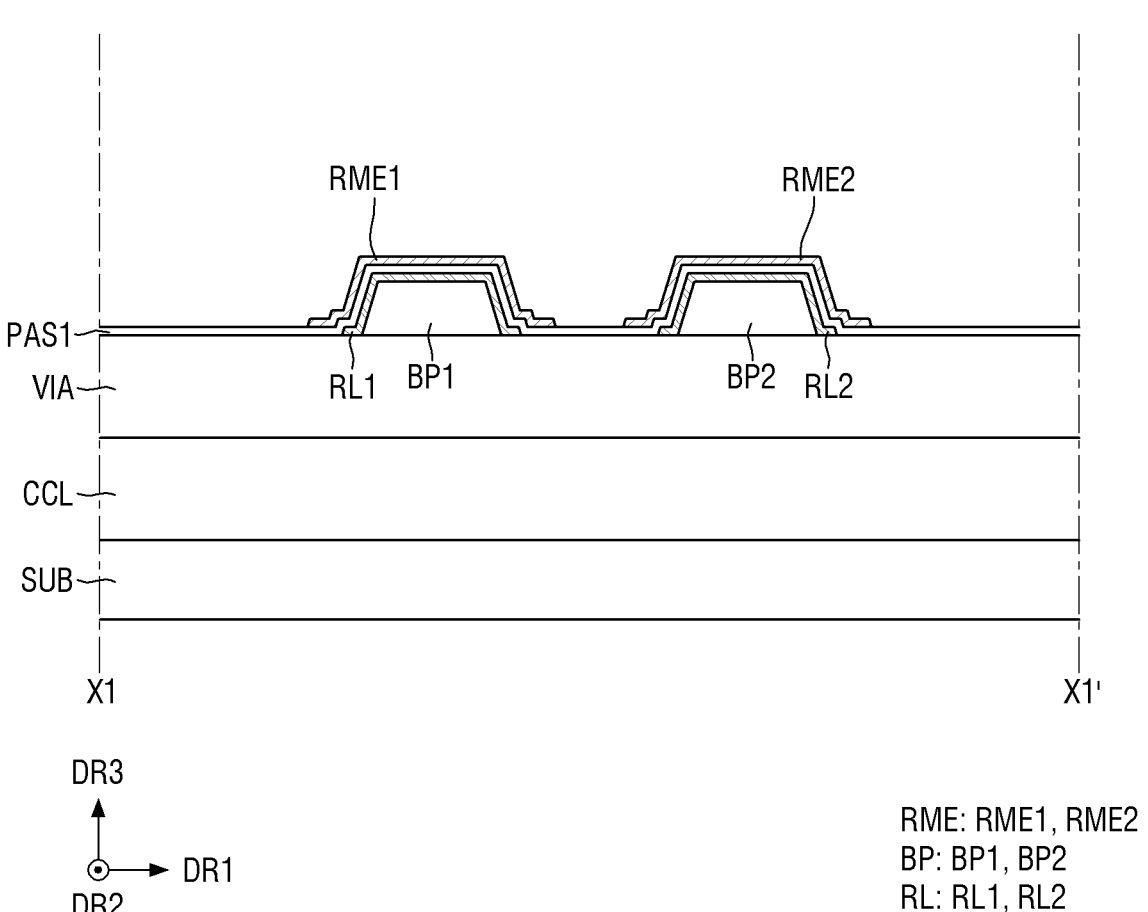

Subsequently, referring to FIG. 14, the first insulating layer PAS1 may be formed on the first reflective layer RL1, the second reflective layer RL2, and the via insulating layer VIA and the first alignment electrode RME1 and the second alignment electrode RME2 may be formed on the first insulating layer PAS1.

After forming the first insulating layer PAS1, a process of forming the first electrode contact hole CTD and the second electrode contact hole CTS on the first insulating layer PAS1 as shown in FIG. 8 may be added before forming the first alignment electrode RME1 and the second alignment electrode RME2 on the first insulating layer PAS1.

Since the first insulating layer PAS1 is formed on the first reflective layer RL1 and the second reflective layer RL2, the damage to the first reflective layer RL1 and the second reflective layer RL2 that occurs in the process of forming the first alignment electrode RME1 and the second alignment electrode RME2 may be prevented.

Figure 15:
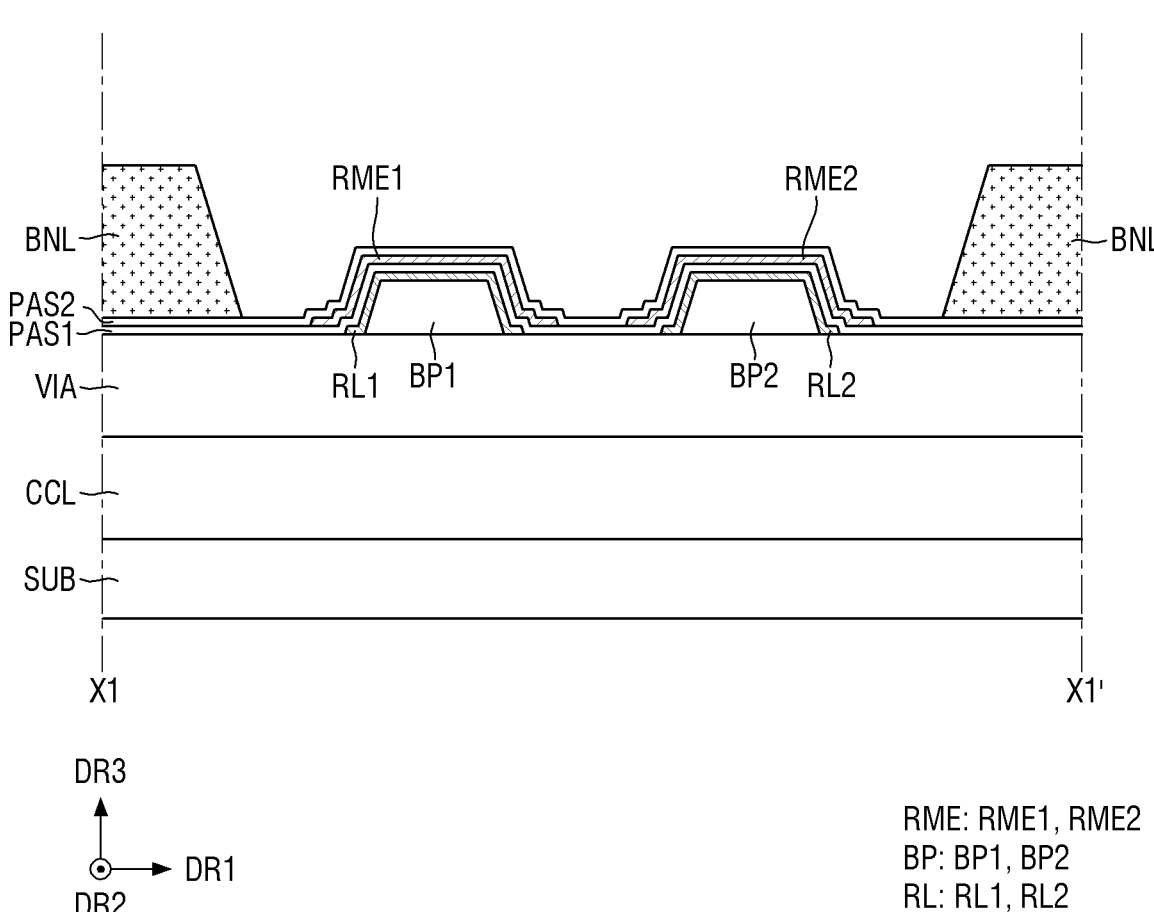

Subsequently, referring to FIG. 15, the second insulating layer PAS2 may be formed on the first alignment electrode RME1, the second alignment electrode RME2 and the first insulating layer PAS1 and the external bank BNL may be disposed on the second insulating layer PAS2.

Since the second insulating layer PAS2 is formed on the first alignment electrode RME1 and the second alignment electrode RME2, the damage to the first alignment electrode RME1 and the second alignment electrode RME2 that occurs in the process of forming the external bank BNL may be prevented.

Figure 16:
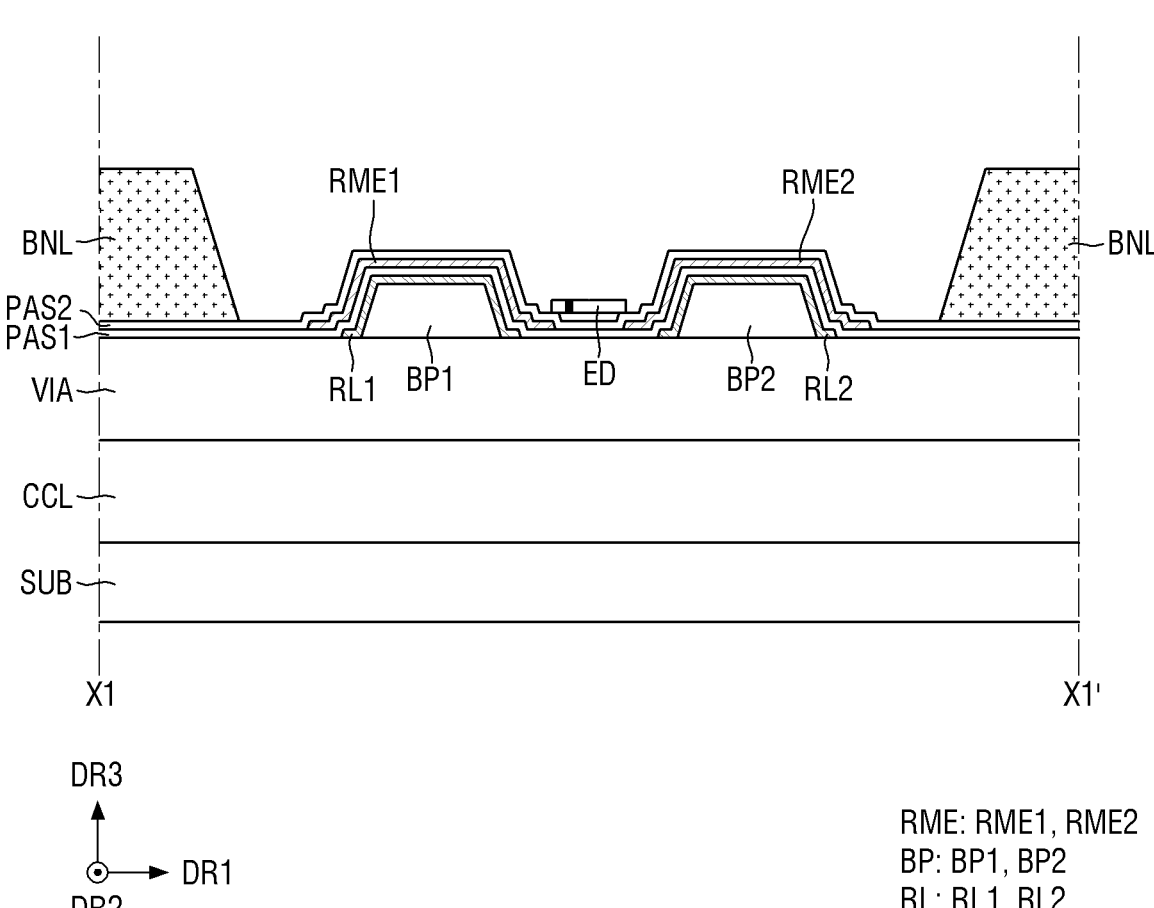

Subsequently, referring to FIG. 16, The light emitting element ED may be aligned in a space between the first alignment electrode RME1 and the second alignment electrode RME2. The process of aligning the light emitting elements ED may be performed by using a dielectrophoresis (DEP) force caused by an electric field generated by alignment signals having different potential values.

For example, ink in which light emitting elements ED are dispersed may be discharged on the space between the first alignment electrode RME1 and the second alignment electrode RME2 by using the ink-jet printing device, alignment signals having different potential values may be applied to each of the first alignment electrode RME1 and the second alignment electrode RME2 to form an electric field, and then the light emitting elements ED may be aligned on the space between the first alignment electrode RME1 and the second alignment electrode RME2 by using the electric field.

In case that the third insulating layer PAS3, the first connection electrode CNE1, the fourth insulating layer PAS4 and the second connection electrode CNE2 are formed on the light emitting element ED, the display device 1 according to the embodiment of FIG. 7 may be manufactured.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
a first internal bank and a second internal bank spaced apart from each other on a substrate;
a first reflective layer disposed on the first internal bank;
a second reflective layer spaced apart from the first reflective layer and disposed on the second internal bank;
a first insulating layer disposed on the first reflective layer and the second reflective layer;
a first electrode disposed on the first insulating layer and overlapping the first reflective layer;
a second electrode disposed on the first insulating layer, the second electrode overlapping the second reflective layer and spaced apart from the first electrode;
a second insulating layer disposed on the first electrode and the second electrode;
a light emitting element disposed on the second insulating layer and overlapping a space between the first electrode and the second electrode;
a first connection electrode disposed on the second insulating layer, overlapping the first insulating layer, and being in contact with a first end portion of the light emitting element; and
a second connection electrode disposed on the second insulating layer, overlapping the second reflective layer, and being in contact with a second end portion of the light emitting element.

2. The display device of claim 1, wherein
edge portions the first reflective layer in plan view extend along edge portions of the first internal bank in plan view, and
edge portions of the second reflective layer in plan view extend along edge portions of the second internal bank in plan view.

3. The display device of claim 2, wherein
the first reflective layer completely covers the first internal bank, and
the second reflective layer completely covers the second internal bank.

4. The display device of claim 1, wherein
a reflectance of the first reflective layer is higher than a reflectance of the first electrode, and
a reflectance of the second reflective layer is higher than a reflectance of the second electrode.

5. The display device of claim 4, wherein the first reflective layer and the second reflective layer comprise at least one of silver (Ag), copper (Cu), and aluminum (Al).

6. The display device of claim 5, wherein
a transmittance of the first electrode is higher than a transmittance of the first reflective layer, and
a transmittance of the second electrode is higher than a transmittance of the second reflective layer.

7. The display device of claim 6, wherein the first electrode and the second electrode comprise a transparent conductive oxide.

8. The display device of claim 1, further comprising:
a via insulating layer disposed on the substrate; and
a driving transistor disposed between the via insulating layer and the substrate, the driving transistor that applies a first power voltage to the light emitting element, wherein
the first internal bank and the second internal bank are disposed directly on the via insulating layer, the first electrode is electrically connected to the driving transistor through a contact hole penetrating the via insulating layer, and
the first reflective layer is electrically insulated from the driving transistor by the via insulating layer.

9. The display device of claim 8, wherein
the first connection electrode is electrically connected through a contact hole penetrating the first electrode and the second insulating layer, and
the first connection electrode and the first reflective layer are electrically insulated from each other.

10. The display device of claim 9, further comprising:
a power line disposed between the via insulating layer and the substrate, the power line that applies a second power voltage having a potential value lower than that of the first power voltage to the light emitting element, wherein
the second electrode is electrically connected to the power line through a second contact hole penetrating the via insulating layer, and
the second reflective layer is electrically insulated from the power line by the via insulating layer.

11. The display device of claim 10, wherein
the second connection electrode is electrically connected to a contact hole penetrating the second electrode and the second insulating layer, and
the second connection electrode is electrically insulated from the second reflective layer.

12. The display device of claim 11, wherein
the first electrode is in direct contact with a source electrode of the driving transistor,
the source electrode comprises copper, and
the first electrode comprises a transparent conductive oxide.

13. The display device of claim 12, wherein
the second electrode is in direct contact with the power line,
the power line comprises copper, and
the second electrode comprises a transparent conductive oxide.

14. A method of manufacturing a display device, the method comprising:
forming an internal bank on a substrate;
forming a first internal bank and a second internal bank by etching the internal bank, the first internal bank spaced apart from the second internal bank;
forming a reflective material layer on the first internal bank and the second internal bank;
forming a first reflective layer and a second reflective layer by etching the reflective material layer, the first reflective layer disposed on the first internal bank, the second reflective layer spaced apart from the first reflective layer and disposed on the second internal bank;
forming a first insulating layer on the first reflective layer and the second reflective layer;
forming a first electrode and a second electrode on the first insulating layer, the first electrode overlapping the first reflective layer, the second electrode spaced apart from the first electrode and overlapping the second reflective layer; and
aligning light emitting elements on a space between the first electrode and the second electrode.

15. The method of claim 14, wherein a reflectance of the first reflective layer is higher than a reflectance of the first electrode, and a reflectance of the second reflective layer is higher than a reflectance of the second electrode.

16. The method of claim 15, wherein the first reflective layer and the second reflective layer comprise at least one of silver (Ag), copper (Cu), or aluminum (Al).

17. The method of claim 16, wherein a transmittance of the first electrode is higher than a transmittance of the first reflective layer, and a transmittance of the second electrode is higher than a transmittance of the second reflective layer.

18. The method of claim 17, wherein the first electrode and the second electrode comprise a transparent conductive oxide.

19. The method of claim 18, wherein the etching of the internal bank and the etching of the reflective material layer are performed by using a same mask, wherein edge portions of the first reflective layer in plan view extend along edge portions of the first internal bank in plan view, and wherein edge portions of the second reflective layer in plan view extend edge portions of the second internal bank in plan view.

20. An electronic device comprising:

a first internal bank and a second internal bank spaced apart from each other on a substrate;

a first reflective layer disposed on the first internal bank;

a second reflective layer spaced apart from the first reflective layer and disposed on the second internal bank;

a first insulating layer disposed on the first reflective layer and the second reflective layer;

a first electrode disposed on the first insulating layer and overlapping the first reflective layer;

a second electrode disposed on the first insulating layer, the second electrode overlapping the second reflective layer and spaced apart from the first electrode;

a second insulating layer disposed on the first electrode and the second electrode; and a light emitting element disposed on the second insulating layer and overlapping a space between the first electrode and the second electrode;

a first connection electrode disposed on the second insulating layer, overlapping the first insulating layer, and being in contact with a first end portion of the light emitting element; and a second connection electrode disposed on the second insulating layer, overlapping the second reflective layer, and being in contact with a second end portion of the light emitting element.

* * * * *